(12) United States Patent
Krishnamoorthy et al.

(10) Patent No.: US 11,879,939 B2
(45) Date of Patent: Jan. 23, 2024

(54) SYSTEM AND METHOD FOR TESTING CLOCKING SYSTEMS IN INTEGRATED CIRCUITS

(71) Applicant: NXP B.V., Eindhoven (NL)

(72) Inventors: Nikila Krishnamoorthy, Chennai (IN); Abhishek Mahajan, Noida (IN); Rishabh Kaistha, Nangal (IN); Varsha Bansal, Patiala (IN)

(73) Assignee: NXP B.V., Eindhoven (NL)

( * ) Notice: Subject to any disclaimer, the term of this patent is extended or adjusted under 35 U.S.C. 154(b) by 179 days.

(21) Appl. No.: 17/650,263

(22) Filed: Feb. 8, 2022

(65) Prior Publication Data

US 2023/0251310 A1    Aug. 10, 2023

(51) Int. Cl.

| | |
|---|---|
| G01R 31/317 | (2006.01) |
| H03K 3/037 | (2006.01) |
| G06F 1/06 | (2006.01) |
| G06F 11/00 | (2006.01) |
| G01R 31/00 | (2006.01) |
| G01R 31/28 | (2006.01) |
| G06F 11/07 | (2006.01) |
| H03K 19/20 | (2006.01) |
| G01R 31/319 | (2006.01) |
| G06F 11/27 | (2006.01) |

(52) U.S. Cl.
CPC ... *G01R 31/31727* (2013.01); *G01R 31/2882* (2013.01); *G01R 31/31922* (2013.01); *G06F 1/06* (2013.01); *G06F 11/076* (2013.01); *G06F 11/27* (2013.01); *H03K 3/037* (2013.01); *H03K 19/20* (2013.01)

(58) Field of Classification Search
CPC .......... G01R 31/31727; G01R 31/2882; G01R 31/31922; G06F 1/06; G06F 11/076; G06F 11/27; H03K 3/037; H03K 19/20; H03M 13/00
See application file for complete search history.

(56) References Cited

U.S. PATENT DOCUMENTS

| | | | |
|---|---|---|---|
| 4,801,875 A | 1/1989 | Ige | |
| 6,671,839 B1 * | 12/2003 | Cote | ............... G01R 31/318566 324/73.1 |
| 7,358,715 B2 | 4/2008 | Shiota et al. | |
| 7,383,481 B2 * | 6/2008 | Warren | .......... G01R 31/318552 714/724 |

(Continued)

FOREIGN PATENT DOCUMENTS

JP        3442226 B2     9/2003

*Primary Examiner* — Justin R Knapp

(57) ABSTRACT

An integrated circuit (IC) includes a clocking system that generates first and second clock signals and a clock enable signal, and a testing system that tests the clocking system. During a capture phase of an at-speed testing mode of the IC, the second clock signal is a gated version of the first clock signal and includes two clock pulses. The testing system determines a first count of clock pulses of the first clock signal between an activation of the capture phase and an assertion of the clock enable signal. Similarly, the testing system determines a second count of clock pulses of the first clock signal between the two clock pulses of the second clock signal. The testing system then compares the first count with a first reference value and the second count with a second reference value to detect a fault in the clocking system.

20 Claims, 7 Drawing Sheets

(56) References Cited

U.S. PATENT DOCUMENTS

| | | | |
|---|---|---|---|
| 7,689,885 B2* | 3/2010 | Kaibel | G01R 31/318544 |
| | | | 714/731 |
| 8,612,815 B2* | 12/2013 | Pakbaz | G01R 31/31813 |
| | | | 714/733 |
| 8,850,280 B2* | 9/2014 | Tekumalla | G01R 31/318594 |
| | | | 714/731 |
| 8,898,527 B2 | 11/2014 | Kumar et al. | |
| 8,937,496 B1 | 1/2015 | Ahmad et al. | |
| 10,579,454 B2* | 3/2020 | Acharya | G11C 29/50012 |
| 10,795,783 B2 | 10/2020 | Wojewoda et al. | |
| 10,948,538 B2* | 3/2021 | Makkar | G11C 19/28 |
| 11,604,221 B1* | 3/2023 | Pradeep | G11C 19/287 |

* cited by examiner

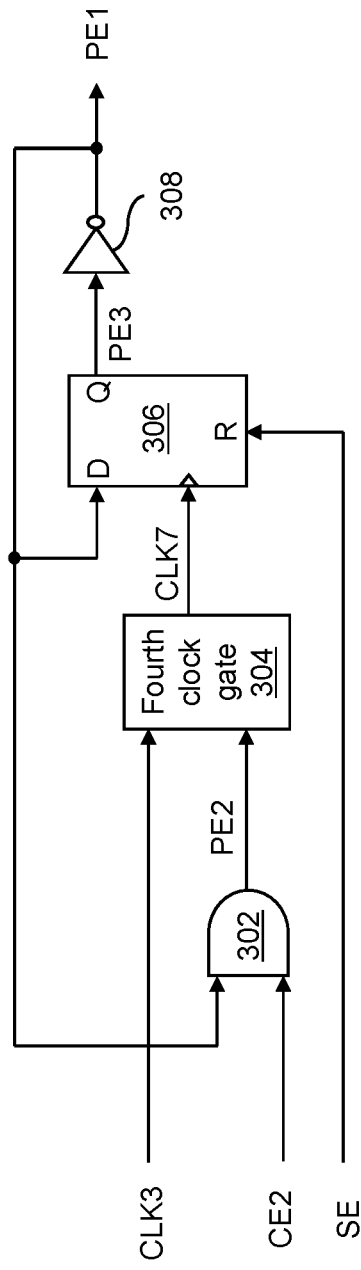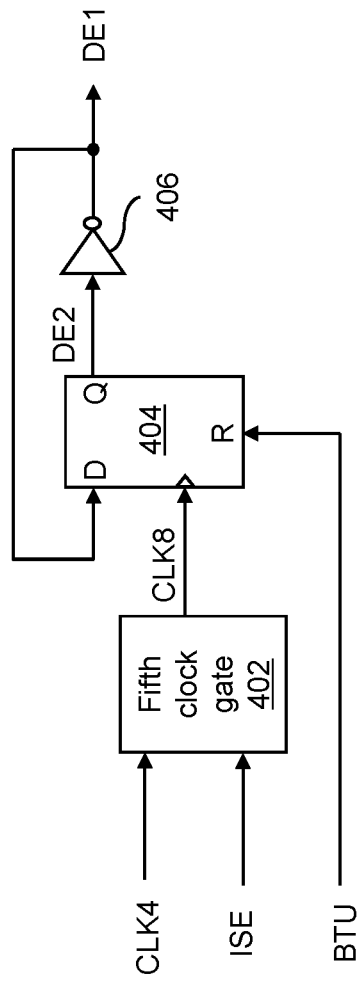

SYSTEM AND METHOD FOR TESTING CLOCKING SYSTEMS IN INTEGRATED CIRCUITS

FIELD OF USE

The present disclosure relates generally to electronic circuits, and, more particularly, to a system and a method for testing clocking systems in integrated circuits.

BACKGROUND

Scan chains are typically included in an integrated circuit (IC) for structural testing of the IC. The IC additionally includes a clocking system that provides various clock signals to the scan chains to control operations of the scan chains. A fault may occur in the clocking system that may result in inaccurate testing of the IC.

BRIEF DESCRIPTION OF DRAWINGS

The following detailed description of the embodiments of the present disclosure will be better understood when read in conjunction with the appended drawings. The present disclosure is illustrated by way of example, and not limited by the accompanying figures, in which like references indicate similar elements.

FIG. 3 illustrates a schematic circuit diagram of a pipeline controller of the testing system of FIG. 2 in accordance with an embodiment of the present disclosure;

FIG. 4 illustrates a schematic circuit diagram of a division controller of the testing system of FIG. 2 in accordance with an embodiment of the present disclosure;

DETAILED DESCRIPTION

Figure 1:
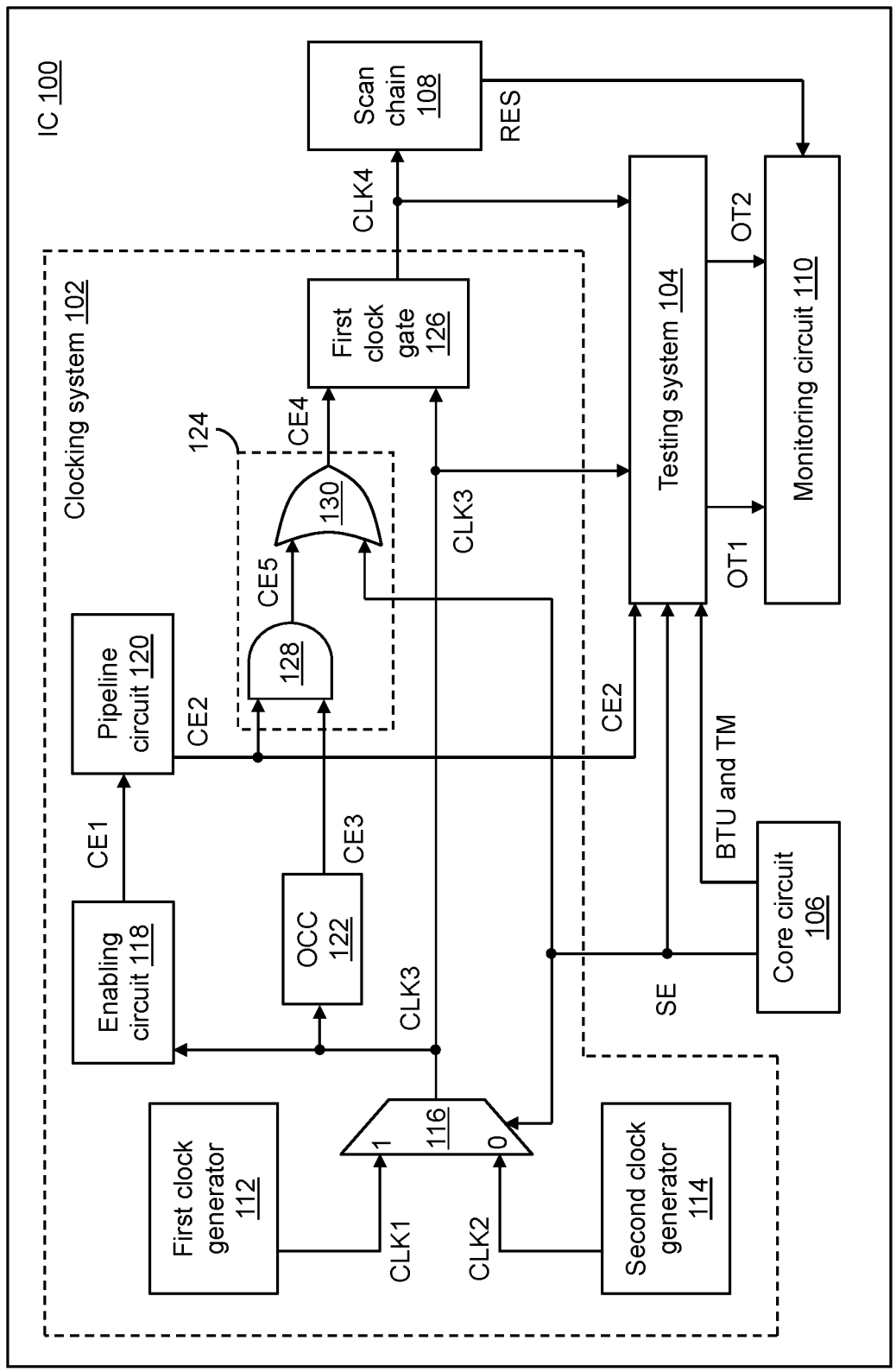
FIG. 1 illustrates a schematic block diagram of an integrated circuit (IC) in accordance with an embodiment of the present disclosure.

The detailed description of the appended drawings is intended as a description of the embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

In an embodiment of the present disclosure, an integrated circuit (IC) is disclosed. The IC may include a clocking system and a testing system that may be coupled to the clocking system. The clocking system may be configured to generate a first clock signal, a first clock enable signal, and a second clock signal. The first clock enable signal may enable division of the first clock signal, and the second clock signal may be generated based on the first clock signal and the first clock enable signal. During a capture phase of an at-speed testing mode of the IC, the second clock signal is a gated version of the first clock signal and may include a first clock pulse and a second clock pulse that facilitate testing of the IC. Further, the first clock enable signal is de-asserted based on an activation of the capture phase, and during the capture phase, the first clock enable signal transitions to an asserted state based on a pipeline delay associated with the clocking system. The testing system may be configured to determine a first count of clock pulses of the first clock signal between the activation of the capture phase and the transition of the first clock enable signal. Additionally or alternatively, the testing system may be configured to determine a second count of clock pulses of the first clock signal between the first clock pulse and the second clock pulse. The testing system may be further configured to detect a fault in the clocking system based on at least one of a group consisting of the first count and the second count.

In another embodiment of the present disclosure, a method for testing a clocking system in an IC is disclosed. The method may include determining, by a testing system of the IC, a first count of clock pulses of a first clock signal between an activation of a capture phase of an at-speed testing mode of the IC and a transition of a first clock enable signal. The method may alternatively or additionally include determining, by the testing system, a second count of clock pulses of the first clock signal between a first clock pulse of a second clock signal and a second clock pulse of the second clock signal. The first clock signal, the first clock enable signal, and the second clock signal are generated by the clocking system. The first clock enable signal may enable division of the first clock signal. Further, the first clock enable signal is de-asserted based on the activation of the capture phase, and during the capture phase, the first clock enable signal transitions to an asserted state based on a pipeline delay associated with the clocking system. The second clock signal may be generated based on the first clock signal and the first clock enable signal. During the capture phase, the second clock signal is a gated version of the first clock signal, and may include the first clock pulse and the second clock pulse. The method may further include detecting, by the testing system, a fault in the clocking system based on at least one of a group consisting of the first count and the second count.

In some embodiments, the testing system may be further configured to compare the first count with a first reference value. Additionally or alternatively, the testing system may be configured to compare the second count with a second reference value. At least one of a group consisting of a mismatch between the first count and the first reference value and a mismatch between the second count and the second reference value is indicative of a presence of the fault in the clocking system.

In some embodiments, the testing system may include a counter. The counter may be configured to receive a third clock signal. The third clock signal may be generated based on the first clock signal and at least one of a group consisting of a first pipeline enable signal and a first division enable signal. The first pipeline enable signal is asserted based on the activation of the capture phase, and during the capture phase, the first pipeline enable signal is de-asserted based on the transition of the first clock enable signal. Further, during the capture phase, the first division enable signal is asserted based on an assertion of the first clock pulse and de-asserted based on an assertion of the second clock pulse. The counter may be further configured to generate a count value based on the third clock signal. When the third clock signal is generated based on the first pipeline enable signal, the third clock signal is same as the first clock signal based on the assertion of the first pipeline enable signal, and the count value is incremented for each clock pulse of the third clock signal. Further, the count value when the first pipeline enable signal is de-asserted corresponds to the first count. Conversely, when the third clock signal is generated based on the first division enable signal, the third clock signal is same as the first clock signal based on the assertion of the first division enable signal, and the count value is incremented for each clock pulse of the third clock signal. Further, the count value when the first division enable signal is de-asserted corresponds to the second count.

In some embodiments, the testing system may further include a first flip-flop and a first inverter that may be coupled to the first flip-flop. The first flip-flop may be configured to generate a second pipeline enable signal based on a scan enable signal, the first pipeline enable signal, and a fourth clock signal. The fourth clock signal may be generated based on the first clock signal, the first clock enable signal, and the first pipeline enable signal. The first inverter may be configured to generate the first pipeline enable signal as an inverted version of the second pipeline enable signal. A transition of the scan enable signal from an asserted state to a de-asserted state is indicative of the activation of the capture phase. Based on the activation of the capture phase, the second pipeline enable signal is de-asserted and the first pipeline enable signal is asserted. Further, during the capture phase, based on a transition of the fourth clock signal, the second pipeline enable signal is asserted and the first pipeline enable signal is de-asserted.

In some embodiments, the testing system may further include a first logic gate that may be coupled to the clocking system, and a first clock gate that may be coupled to the clocking system, the first logic gate, and the first flip-flop. The first logic gate may be configured to generate a third pipeline enable signal based on the first clock enable signal and the first pipeline enable signal. The third pipeline enable signal is asserted based on the assertion of the first clock enable signal and the first pipeline enable signal. Further, the third pipeline enable signal is de-asserted based on the de-assertion of at least one of a group consisting of the first pipeline enable signal and the first clock enable signal. The first clock gate may be configured to generate the fourth clock signal based on the first clock signal and the third pipeline enable signal, and provide the fourth clock signal to the first flip-flop. The fourth clock signal is de-asserted based on the de-assertion of the third pipeline enable signal, and the fourth clock signal is same as the first clock signal based on the assertion of the third pipeline enable signal.

In some embodiments, the testing system may further include a second flip-flop and a second inverter that may be coupled to the second flip-flop. The second flip-flop may be configured to generate a second division enable signal based on the first division enable signal and a fifth clock signal. The fifth clock signal is same as the second clock signal during the capture phase. The second inverter may be configured to generate the first division enable signal as an inverted version of the second division enable signal. Based on the activation of the capture phase, the second division enable signal is asserted and the first division enable signal is de-asserted. Further, during the capture phase, the second division enable signal is de-asserted and the first division enable signal is asserted based on the assertion of the first clock pulse, and the second division enable signal is asserted and the first division enable signal is de-asserted based on the assertion of the second clock pulse. The first clock pulse and the second clock pulse are sequential.

In some embodiments, the testing system may further include a second clock gate that may be coupled to the clocking system and the second flip-flop. The second clock gate may be configured to generate the fifth clock signal based on the second clock signal and an inverted version of a scan enable signal, and provide the fifth clock signal to the second flip-flop. The fifth clock signal is de-asserted based on an assertion of the scan enable signal, and the fifth clock signal is same as the second clock signal based on a de-assertion of the scan enable signal. The scan enable signal is de-asserted during the capture phase.

In some embodiments, the testing system may further include a first logic circuit and a third clock gate that may be coupled to the first logic circuit and the counter. The first logic circuit may be configured to generate a counter enable signal based on the first pipeline enable signal and the first division enable signal. During the capture phase, the counter enable signal is asserted based on the assertion of at least one of a group consisting of the first pipeline enable signal and the first division enable signal. Further, the counter enable signal is de-asserted based on the de-assertion of the first pipeline enable signal and the first division enable signal. The third clock gate may be configured to generate the third clock signal based on the first clock signal and the counter enable signal. The third clock signal is de-asserted based on the de-assertion of the counter enable signal, and the third clock signal is same as the first clock signal based on the assertion of the counter enable signal.

In some embodiments, the testing system may further include a reset controller that may be coupled to the clocking system and the counter. The reset controller may be configured to generate a reset signal and provide the reset signal to the counter to reset the counter. The reset signal is asserted based on the de-assertion of the first pipeline enable signal. The counter is reset based on the assertion of the reset signal.

In some embodiments, the reset controller may include a third flip-flop, a third inverter that may be coupled to the third flip-flop, and a fourth flip-flop that may be coupled to the clocking system and the third flip-flop. The third flip-flop may be configured to generate a first control signal based on the first pipeline enable signal and a sixth clock signal. The sixth clock signal may be generated based on the first clock enable signal and the first clock signal. The first control signal is same as the first pipeline enable signal based on a transition of the sixth clock signal. The third inverter may be configured to generate a second control signal as an inverted version of the first control signal. The fourth flip-flop may be configured to generate a third control signal based on the first control signal and the first clock signal. The third control signal is same as the first control signal based on the transition of the first clock signal. Based on the assertion of the first pipeline enable signal, the first and second control signals are asserted and de-asserted, respectively, and the reset signal is de-asserted based on the de-assertion of the second control signal. Further, based on the de-assertion of the first pipeline enable signal, the first and second control signals are de-asserted and asserted, respectively, and the third control signal remains asserted until the transition of the first clock signal. In such a scenario, the reset signal is asserted based on the assertion of the second control signal and the third control signal.

In some embodiments, the reset controller may further include a fourth clock gate that may be coupled to the clocking system and the third flip-flop. The fourth clock gate may be configured to generate the sixth clock signal based on the first clock signal and an inverted version of the first clock enable signal, and provide the sixth clock signal to the third flip-flop. The sixth clock signal is the same as the first clock signal based on the de-assertion of the first clock enable signal. Further, the sixth clock signal is de-asserted based on the assertion of the first clock enable signal.

In some embodiments, the reset controller may further include a second logic gate that may be coupled to the fourth flip-flop and the third inverter, and a third logic gate that may be coupled to the counter and the second logic gate. The second logic gate may be configured to generate a fourth control signal based on the second control signal, the third control signal, and an inverted version of the first pipeline enable signal. The fourth control signal is de-asserted based on at least one of a group consisting of the de-assertion of the second control signal, a de-assertion of the third control signal, and the assertion of the first pipeline enable signal. Further, the fourth control signal is asserted based on the assertion of the second control signal, the assertion of the third control signal, and the de-assertion of the first pipeline enable signal. The third logic gate may be configured to generate the reset signal based on the fourth control signal and a scan enable signal, and provide the reset signal to the counter. During the capture phase, the scan enable signal is de-asserted and the reset signal is same as the fourth control signal.

In some embodiments, the testing system may include a first comparator. The first comparator may be configured to compare the first count with a first reference value, detect the fault in the clocking system based on the comparison of the first count with the first reference value, and generate a first output signal indicative of the detected fault. The detected fault corresponds to a pipeline fault associated with the clocking system. A mismatch between the first count and the first reference value is indicative of a presence of the fault in the clocking system.

In some embodiments, the testing system may further include a fifth clock gate and a latch that may be coupled to the first comparator and the fifth clock gate. The fifth clock gate may be configured to generate a seventh clock signal based on the first clock signal and a first pipeline enable signal. The first pipeline enable signal is asserted based on the activation of the capture phase, and during the capture phase, the first pipeline enable signal is de-asserted based on the transition of the first clock enable signal. The seventh clock signal is de-asserted based on the de-assertion of the first pipeline enable signal, and the seventh clock signal is same as the first clock signal based on the assertion of the first pipeline enable signal. The latch may be configured to receive the first output signal and the seventh clock signal, and generate a second output signal. The second output signal is same as the first output signal based on an assertion of the seventh clock signal. Further, the second output signal is a latched version of the first output signal based on the de-assertion of the first pipeline enable signal.

In some embodiments, the testing system may include a second comparator. The second comparator may be configured to compare the second count with a second reference value, detect the fault in the clocking system based on the comparison of the second count with the second reference value, and generate a third output signal indicative of the detected fault. The detected fault corresponds to a division fault associated with the first clock pulse and the second clock pulse. A mismatch between the second count and the second reference value is indicative of a presence of the fault in the clocking system.

In some embodiments, the clocking system may include an enabling circuit and a pipeline circuit that may be coupled to the enabling circuit. The enabling circuit may be configured to generate a second clock enable signal based on the first clock signal. The second clock enable signal enables the division of the first clock signal. The pipeline circuit may be configured to generate the first clock enable signal based on the second clock enable signal. The first clock enable signal is a delayed version of the second clock enable signal. A delay introduced by the pipeline circuit is indicative of the pipeline delay associated with the clocking system.

In some embodiments, the clocking system may include an on-chip clock controller (OCC), a second logic circuit that may be coupled to the pipeline circuit and the OCC, and a sixth clock gate that may be coupled to the second logic circuit. The OCC may be configured to generate a third clock enable signal based on the first clock signal. During the capture phase, the third clock enable signal facilitates the generation of the second clock signal including the first clock pulse and the second clock pulse. The second logic circuit may be configured to generate a fourth clock enable signal based on the first clock enable signal, the third clock enable signal, and a scan enable signal. The fourth clock enable signal is asserted based on at least one of a group consisting of an assertion of the scan enable signal and the assertion of each of the first and third clock enable signals. Further, the fourth clock enable signal is de-asserted based on a de-assertion of the scan enable signal and at least one of a group consisting of the de-assertion of the first clock enable signal and a de-assertion of the third clock enable signal. The sixth clock gate may be configured to generate the second clock signal based on the first clock signal and the fourth clock enable signal. The second clock signal is de-asserted based on the de-assertion of the fourth clock enable signal, and the second clock signal is same as the first clock signal based on the assertion of the fourth clock enable signal.

In some embodiments, the clocking system may further include a first clock generator, a second clock generator, and a multiplexer that may be coupled to the first clock generator and the second clock generator. The first clock generator may be configured to generate an eighth clock signal associated with a shift phase of the at-speed testing mode, and the second clock generator may be configured to generate a ninth clock signal associated with the capture phase. The multiplexer may be configured to generate the first clock signal based on the eighth and ninth clock signals and a scan enable signal. Based on an assertion of the scan enable signal, the first clock signal is same as the eighth clock signal, and based on a de-assertion of the scan enable signal, the first clock signal is same as the ninth clock signal.

During at-speed testing of an integrated circuit (IC), a fault in a clocking system of the IC may lead to inaccurate detection of presence or absence of faults in the IC. For example, the fault in the clocking system may lead to the IC being deemed as faulty even when there are no structural faults in functional components (e.g., flip-flops, combinational circuits, or the like) of the IC or deemed as fault-free even when there are structural faults in the functional components of the IC. In the first scenario, a fault-free IC may be discarded (e.g., may not be employed in the field for its designated application), whereas in the second scenario, the reliability of the IC significantly degrades. Conventionally, the clocking system is tested for faults based on functional patterns during a functional mode of the IC. The degree of testing provided by the functional patterns is limited. Hence, such testing of the clocking system is not exhaustive and the reliability of the IC remains degraded.

Various embodiments of the present disclosure disclose an IC that may include a clocking system and a testing system. The clocking system may generate a first clock signal, a clock enable signal, and a second clock signal. The clock enable signal is utilized for dividing the first clock signal. The second clock signal is generated based on the first clock signal and the clock enable signal. During a capture phase of an at-speed testing mode of the IC, the second clock signal is a gated version of the first clock signal and includes two clock pulses that facilitate the at-speed testing of the IC. Further, the clock enable signal is de-asserted based on an activation of the capture phase, and during the capture phase, the clock enable signal transitions to an asserted state based on a pipeline delay associated with the clocking system. The testing system may test the clocking system during the at-speed testing mode. For example, the testing system may determine a first count of clock pulses of the first clock signal between the activation of the capture phase and the transition of the clock enable signal. The testing system may alternatively or additionally determine a second count of clock pulses of the first clock signal between the two clock pulses of the second clock signal. Further, the testing system may detect a fault in the clocking system based on at least one of the first and second counts.

The testing system of the present disclosure thus enables the testing of the clocking system during the at-speed testing mode. Further, the testing system may identify whether the fault in the clocking system is a pipeline fault (e.g., a fault in a pipeline circuit of the clocking system) or a division fault (e.g., a fault in other components, such as an on-chip clock controller, a clock gate, or the like, of the clocking system). Thus, a testing technique implemented by the testing system of the present disclosure is more exhaustive than conventional testing techniques. As a result, the reliability of the IC including the testing system of the present disclosure is significantly greater than the reliability of ICs where conventional testing techniques are implemented.

FIG. 1 illustrates a schematic block diagram of an integrated circuit (IC) 100 in accordance with an embodiment of the present disclosure. The IC 100 may include a clocking system 102, a testing system 104, a core circuit 106, a scan chain 108, and a monitoring circuit 110. The clocking system 102 may include a first clock generator 112, a second clock generator 114, a multiplexer 116, an enabling circuit 118, a pipeline circuit 120, an on-chip clock controller (OCC) 122, a first logic circuit 124, and a first clock gate 126. The IC 100 may be utilized in automotive devices, data processing devices, networking devices, or the like.

The following table illustrates various signals and data described in FIG. 1:

| Signal/Data | Description |
| --- | --- |
| First clock signal CLK1 | Generated by the first clock generator 112 and utilized during a shift phase of an at-speed testing mode of the IC 100 |
| Second clock signal CLK2 | Generated by the second clock generator 114 and utilized during a capture phase of the at-speed testing mode and a functional mode of the IC 100 |
| Third clock signal CLK3 | Same as the first clock signal CLK1 during the shift phase and same as the second clock signal CLK2 during the capture phase and the functional mode |
| Fourth clock signal CLK4 | Corresponds to a divided version of the third clock signal CLK3 during the shift phase and the functional mode, and to a gated version of the third clock signal CLK3 during the capture phase |
| Scan enable signal SE | Indicative of the mode of operation of the IC 100 (e.g., the functional mode, the shift phase, or the capture phase) |
| First clock enable signal CE1 | Enables division of the third clock signal CLK3 |
| Second clock enable signal CE2 | Delayed version of the first clock enable signal CE1 |
| Third clock enable signal CE3 | Facilitates generation of clock pulses during the capture phase for at-speed testing of the IC 100 |
| Fifth clock enable signal CE5 | Generated by performing an AND operation on the second and third clock enable signals CE2 and CE3 |
| Fourth clock enable signal CE4 | Generated by performing an OR operation on the fifth clock enable signal CE5 and the scan enable signal SE |
| Boot-up enable signal BTU | Asserted during a boot-up of the IC 100 and de-asserted after the IC 100 has booted up |
| Test mode indicator signal TM | Indicates whether the IC 100 is in the at-speed testing mode or the functional mode |
| First output signal OT1 | Indicates whether the pipeline circuit 120 is faulty |
| Second output signal OT2 | Indicates whether at least one of the enabling circuit 118, the OCC 122, the first logic circuit 124, and the first clock gate 126 is faulty |
| Response RES | Response of the IC 100 to a test pattern captured in the scan chain 108 during the capture phase |

The scan chain 108 may be utilized for the structural testing of the IC 100 (e.g., to detect faults in various functional components of the IC 100, such as combinational circuits, flip-flops, or the like). The scan chain 108, and in turn, the IC 100 may be configured to operate in a functional mode and a testing mode. During the functional mode, various functional operations may be performed in the IC 100 (e.g., functional data may be stored in the scan chain 108), whereas during the testing mode, the IC 100 is tested for structural faults based on the scan chain 108. The structural testing implemented in the IC 100 corresponds to at-speed testing. Thus, the testing mode is hereinafter referred to as an "at-speed testing mode". In an embodiment, the at-speed testing mode corresponds to an at-speed automatic test pattern generation (ATPG) test mode. In another embodiment, the at-speed testing mode corresponds to an at-speed logic built-in self-test (LBIST) mode. The at-speed testing mode includes two phases, namely, a shift phase and a capture phase. During the shift phase, a test pattern (not shown) may be shifted through the scan chain 108. Further, during the capture phase, a response RES of the IC 100 to the test pattern may be captured in the scan chain 108. The capture phase is followed by another shift phase where the captured response RES is shifted out of the scan chain 108. The IC 100 is tested for the structural faults based on the captured response RES.

During the functional mode, the scan chain 108 may be synchronized based on a functional clock signal, whereas during the shift phase of the at-speed testing mode, the scan chain 108 may be synchronized based on a test clock signal. A frequency of the test clock signal is less than that of the functional clock signal. Further, during the capture phase in the at-speed testing, two clock pulses of same frequency as that of the functional clock signal are required for the scan chain 108 to capture the response RES accurately. The two clock pulses are spaced apart to facilitate the at-speed testing of the IC 100. The clocking system 102 is included on the IC 100 to provide such clock signals to the scan chain 108 during the functional mode and the at-speed testing mode. However, the clocking system 102 may experience one or more faults therein. The one or more faults may occur in at least one of the enabling circuit 118, the pipeline circuit 120, the OCC 122, the first logic circuit 124, and the first clock gate 126. Further, the one or more faults may result in the generation of inaccurate clock signals, especially during the capture phase. The testing system 104 may be included on the IC 100 to test the clocking system 102 and detect such inaccuracies in the clock signals generated by the clocking system 102 during the capture phase. Further, the testing system 104 may be configured to generate various output signals (e.g., a first output signal OT1 and a second output signal OT2) indicative of the detected one or more faults.

Hence, the captured response RES facilitates testing of various functional components of the IC 100, whereas the first and second output signals OT1 and OT2 facilitate testing of a clocking architecture (e.g., the clocking system 102) of the IC 100. The testing system 104 thus ensures that the one or more faults in the clocking system 102 do not result in inaccurate testing of the IC 100.

Clocking System 102:

The first clock generator 112 may be configured to generate a first clock signal CLK1. The first clock signal CLK1 may be associated with the shift phase (e.g., may be generated to synchronize the scan chain 108 during the shift phase). Thus, the first clock signal CLK1 may correspond to the test clock signal. The second clock generator 114 may be configured to generate a second clock signal CLK2. The second clock signal CLK2 may be further associated with the functional mode (e.g., may be generated to synchronize the scan chain 108 during the functional mode). Thus, the second clock signal CLK2 may correspond to the functional clock signal. The second clock signal CLK2 may be further associated with the capture phase (e.g., may be generated to synchronize the scan chain 108 during the capture phase).

The multiplexer 116 may be coupled to the first clock generator 112, the second clock generator 114, and the core circuit 106. The multiplexer 116 may be configured to receive the first and second clock signals CLK1 and CLK2 from the first and second clock generators 112 and 114, respectively. Further, the multiplexer 116 may be configured to receive a scan enable signal SE from the core circuit 106.

The scan enable signal SE is indicative of an activation of the shift phase of the at-speed testing mode. For example, the scan enable signal SE is asserted during the shift phase. Further, during the functional mode and the capture phase, the scan enable signal SE is de-asserted. Based on the first and second clock signals CLK1 and CLK2 and the scan enable signal SE, the multiplexer 116 may be further configured to generate a third clock signal CLK3. The scan enable signal SE determines whether the third clock signal CLK3 is same as the first clock signal CLK1 or the second clock signal CLK2. For example, based on the assertion of the scan enable signal SE, the third clock signal CLK3 is same as the first clock signal CLK1. Further, based on the de-assertion of the scan enable signal SE, the third clock signal CLK3 is same as the second clock signal CLK2. In other words, the third clock signal CLK3 is same as the first clock signal CLK1 during the shift phase. Further, during the capture phase and the functional mode, the third clock signal CLK3 is same as the second clock signal CLK2.

The enabling circuit 118 may be coupled to the multiplexer 116. The enabling circuit 118 may include suitable circuitry that may be configured to perform one or more operations. For example, the enabling circuit 118 may be configured to receive the third clock signal CLK3 from the multiplexer 116. The enabling circuit 118 may be further configured to generate a first clock enable signal CE1 based on the third clock signal CLK3. The first clock enable signal CE1 enables the division of the third clock signal CLK3. For example, if the third clock signal CLK3 is to be divided by a factor of two, the first clock enable signal CE1 may be generated such that when the first clock enable signal CE1 is an input to a clock gate along with the third clock signal CLK3, each alternate clock pulse of the third clock signal CLK3 may be gated to generate a divided version of the third clock signal CLK3.

The pipeline circuit 120 may be coupled to the enabling circuit 118. The pipeline circuit 120 may include suitable circuitry that may be configured to perform one or more operations. For example, the pipeline circuit 120 may be configured to receive the first clock enable signal CE1 from the enabling circuit 118, and generate a second clock enable signal CE2 based on the first clock enable signal CE1. The second clock enable signal CE2 is a delayed version of the first clock enable signal CE1. Thus, the second clock enable signal CE2 may further enable the division of the third clock signal CLK3. A delay introduced by the pipeline circuit 120 is indicative of a pipeline delay associated with the clocking system 102. In an embodiment, the pipeline circuit 120 may include a series of delay elements (e.g., flip-flops).

The OCC 122 may be coupled to the multiplexer 116. The OCC 122 may include suitable circuitry that may be configured to perform one or more operations. For example, the OCC 122 may be configured to receive the third clock signal CLK3 from the multiplexer 116, and generate a third clock enable signal CE3 based on the third clock signal CLK3. During the capture phase, the third clock enable signal CE3 may facilitate the generation of the two clock pulses required for the at-speed testing of the IC 100. During the functional mode, the third clock enable signal CE3 remains asserted to ensure that the second clock enable signal CE2 controls the clock signal (e.g., the second clock signal CLK2) provided to the scan chain 108. Further, during the shift phase, a logic state of the third clock enable signal CE3 does not affect the test clock signal provided to the scan chain 108.

The first logic circuit 124 may be coupled to the core circuit 106, the pipeline circuit 120, and the OCC 122. The first logic circuit 124 may be configured to receive the second clock enable signal CE2 from the pipeline circuit 120, the third clock enable signal CE3 from the OCC 122, and the scan enable signal SE from the core circuit 106. Based on the second and third clock enable signals CE2 and CE3 and the scan enable signal SE, the first logic circuit 124 may be further configured to generate a fourth clock enable signal CE4. The fourth clock enable signal CE4 is asserted based on the assertion of the scan enable signal SE or an assertion of each of the second and third clock enable signals CE2 and CE3. Further, the fourth clock enable signal CE4 is de-asserted based on the de-assertion of the scan enable signal SE and a de-assertion of at least one of the second and third clock enable signals CE2 and CE3. The first logic circuit 124 may include a first logic gate 128 and a second logic gate 130.

The first logic gate 128 may be coupled to the pipeline circuit 120 and the OCC 122. The first logic gate 128 may be configured to receive the second and third clock enable signals CE2 and CE3 from the pipeline circuit 120 and the OCC 122, respectively. Based on the second and third clock enable signals CE2 and CE3, the first logic gate 128 may be further configured to generate a fifth clock enable signal CE5. In an embodiment, the first logic gate 128 is an AND gate. Thus, the fifth clock enable signal CE5 is asserted based on the assertion of each of the second and third clock enable signals CE2 and CE3. Further, the fifth clock enable signal CE5 is de-asserted based on the de-assertion of at least one of the second and third clock enable signals CE2 and CE3.

The second logic gate 130 may be coupled to the first logic gate 128 and the core circuit 106. The second logic gate 130 may be configured to receive the fifth clock enable signal CE5 and the scan enable signal SE from the first logic gate 128 and the core circuit 106, respectively. Based on the fifth clock enable signal CE5 and the scan enable signal SE, the second logic gate 130 may be further configured to generate the fourth clock enable signal CE4. In an embodiment, the second logic gate 130 is an OR gate. Thus, the fourth clock enable signal CE4 is asserted based on the assertion of at least one of the fifth clock enable signal CE5 and the scan enable signal SE. Further, the fourth clock enable signal CE4 is de-asserted based on the de-assertion of each of the fifth clock enable signal CE5 and the scan enable signal SE.

The first clock gate 126 may be coupled to the first logic circuit 124, the multiplexer 116, and the scan chain 108. The first clock gate 126 may be configured to receive the third clock signal CLK3 and the fourth clock enable signal CE4 from the multiplexer 116 and the first logic circuit 124, respectively. Based on the third clock signal CLK3 and the fourth clock enable signal CE4, the first clock gate 126 may be configured to generate a fourth clock signal CLK4. The fourth clock signal CLK4 is de-asserted based on the de-assertion of the fourth clock enable signal CE4. Further, based on the assertion of the fourth clock enable signal CE4, the fourth clock signal CLK4 is same as the third clock signal CLK3. The first clock gate 126 may be further configured to provide the fourth clock signal CLK4 to the scan chain 108.

During the functional mode, the scan enable signal SE is de-asserted. As a result, the third clock signal CLK3 is same as the second clock signal CLK2. Further, the third clock enable signal CE3 is asserted during the functional mode. Thus, the fourth clock enable signal CE4 is same as the second clock enable signal CE2. The fourth clock signal CLK4 may thus be a divided version of the third clock signal CLK3. During the shift phase, the scan enable signal SE is asserted. Thus, the third clock signal CLK3 is same as the first clock signal CLK1, and the fourth clock enable signal CE4 is asserted. As a result, the fourth clock signal CLK4 is same as the third clock signal CLK3.

A transition of the scan enable signal SE from an asserted state to a de-asserted state is indicative of an activation of the capture phase. As a result, the third clock signal CLK3 is same as the second clock signal CLK2, and the fourth clock enable signal CE4 is same as the fifth clock enable signal CE5. The second clock enable signal CE2 is de-asserted based on the activation of the capture phase, and during the capture phase, the second clock enable signal CE2 transitions to an asserted state based on the pipeline delay associated with the clocking system 102 (e.g., the delay introduced by the pipeline circuit 120). Thus, there is a delay between the activation of the capture phase and an initial transition of the second clock enable signal CE2 from the de-asserted state to the asserted state. Further, the OCC 122 generates the third clock enable signal CE3 such that the third clock enable signal CE3 facilitates the generation of the fourth clock signal CLK4 including a first clock pulse and a second clock pulse. In other words, the third clock enable signal CE3 may be generated such that the fourth clock enable signal CE4 deactivates the first clock gate 126 for all but two clock pulses of the third clock signal CLK3 during the capture phase. The first and second clock pulses are sequential and are spaced apart to facilitate the at-speed testing of the IC 100. The first clock pulse may correspond to a launch pulse for the at-speed testing of the IC 100 and the second clock pulse may correspond to a capture pulse for the at-speed testing of the IC 100. The fourth clock signal CLK4 may thus be a gated version of the third clock signal CLK3 during the capture phase.

The above-described components of the clocking system 102 may experience various faults therein that may result in inaccuracies in the first and second clock pulses of the fourth clock signal CLK4 during the capture phase. The inaccuracies may include a time duration between the first and second clock pulses being different from a first desired value. This is referred to as a division fault and may arise based on set-up and hold violations in at least one of the enabling circuit 118, the OCC 122, the first logic circuit 124, and the first clock gate 126. The inaccuracies may further include a time duration between the activation of the capture phase and the initial transition of the second clock enable signal CE2 being different from a second desired value. This mismatch may arise as a result of a fault (e.g., set-up and hold violations) in the pipeline circuit 120. In other words, the pipeline circuit 120 may introduce a different delay than desired. Such a fault is referred to as a pipeline fault. The pipeline fault may lead to inaccuracy in the selection of the two clock pulses. For example, the time duration between the first and second clock pulses may be equal to the first desired value, however, the two clock pulses selected for the at-speed testing may be inaccurate.

Testing System 104:

The testing system 104 may be coupled to the clocking system 102, the core circuit 106, and the monitoring circuit 110. The testing system 104 may be configured to receive the second clock enable signal CE2, the third clock signal CLK3, and the fourth clock signal CLK4 from the pipeline circuit 120, the multiplexer 116, and the first clock gate 126, respectively. In other words, the testing system 104 may receive the second clock enable signal CE2, the third clock signal CLK3, and the fourth clock signal CLK4 generated by the clocking system 102. Further, the testing system 104 may be configured to receive the scan enable signal SE, a boot-up enable signal BTU, and a test mode indicator signal TM from the core circuit 106. The boot-up enable signal BTU is asserted during a boot-up of the IC 100 and de-asserted after the IC 100 is booted up. Further, the test mode indicator signal TM indicates whether the IC 100 is operating in the at-speed testing mode or the functional mode. For example, the test mode indicator signal TM is asserted during the at-speed testing mode and de-asserted during the functional mode.

The testing system 104 may be further configured to detect the one or more faults in the clocking system 102 during the capture phase based on the second clock enable signal CE2, the third and fourth clock signals CLK3 and CLK4, the scan enable signal SE, and the boot-up enable signal BTU. Further, the testing system 104 may be deactivated during the shift phase and the functional mode based on the scan enable signal SE and the test mode indicator signal TM.

To detect the one or more faults in the clocking system 102, the testing system 104 may be configured to perform various operations. For example, the testing system 104 may be further configured to determine a first count of clock pulses (not shown) of the third clock signal CLK3 between the activation of the capture phase and the initial transition of the second clock enable signal CE2 from the de-asserted state to the asserted state. The first count is thus indicative of the time duration between the activation of the capture phase and the initial transition of the second clock enable signal CE2, and is determined to detect the pipeline fault in the pipeline circuit 120. Further, the testing system 104 may be configured to determine a second count of clock pulses (not shown) of the third clock signal CLK3 between the first and second clock pulses of the fourth clock signal CLK4 (e.g., between positive edges of the first and second clock pulses or between negative edges of the first and second clock pulses). The second count is thus indicative of the time duration between the first and second clock pulses, and is determined to detect the division fault in at least one of the enabling circuit 118, the OCC 122, the first logic circuit 124, and the first clock gate 126. The testing system 104 may be further configured to compare the first count with a first reference value (shown later in FIG. 2) and the second count with a second reference value (shown later in FIG. 2).

An equality of the first count and the first reference value may indicate the absence of the pipeline fault in the pipeline circuit 120. Further, a mismatch between the first count and the first reference value may indicate the presence of the pipeline fault in the pipeline circuit 120. Similarly, an equality of the second count and the second reference value may be indicative of the absence of the division fault in the enabling circuit 118, the OCC 122, the first logic circuit 124, and the first clock gate 126. Further, a mismatch between the second count and the second reference value may be indicative of the presence of the division fault in at least one of the enabling circuit 118, the OCC 122, the first logic circuit 124, and the first clock gate 126. In other words, the equality of the first count and the first reference value, and the equality of the second count and the second reference value are indicative of the absence of any faults in the clocking system 102. Conversely, the mismatch between the first count and the first reference value and/or the mismatch between the second count and the second reference value is indicative of the presence of the one or more faults in the clocking system 102. Thus, based on the comparison of the first count with the first reference value and the second count with the second reference value, the testing system 104 may detect the one or more faults in the clocking system 102.

The testing system 104 may be further configured to generate the first output signal OT1 and the second output signal OT2 to indicate the presence or the absence of the one or more faults in the clocking system 102. The first output signal OT1 is generated based on the comparison of the first count with the first reference value, and the second output signal OT2 is generated based on the comparison of the second count with the second reference value. Thus, the first output signal OT1 may be indicative of the pipeline fault associated with the clocking system 102. Further, the second output signal OT2 may be indicative of the division fault associated with the first and second clock pulses of the fourth clock signal CLK4 (e.g., the time duration between the first and second clock pulses is different from the first desired value). In an embodiment, the first and second output signals OT1 and OT2 are de-asserted when the first and second counts match the first and second reference values, respectively. Further, the first and second output signals OT1 and OT2 are asserted when the first and second counts do not match the first and second reference values, respectively. The testing system 104 may be further configured to provide the first and second output signals OT1 and OT2 to the monitoring circuit 110.

The core circuit 106 may be coupled to the clocking system 102 and the testing system 104. The core circuit 106 may include suitable circuitry that may be configured to perform one or more operations. For example, the core circuit 106 may be configured to generate the scan enable signal SE, the boot-up enable signal BTU, and the test mode indicator signal TM. The core circuit 106 may be further configured to provide the scan enable signal SE to the clocking system 102 (e.g., the multiplexer 116 and the second logic gate 130). Further, the core circuit 106 may be configured to provide the scan enable signal SE, the boot-up enable signal BTU, and the test mode indicator signal TM to the testing system 104.

The scan chain 108 may be coupled to the clocking system 102 and the monitoring circuit 110. The scan chain 108 may include suitable circuitry that may be configured to perform one or more operations. For example, the scan chain 108 may be configured to receive the fourth clock signal CLK4 from the clocking system 102. Although not shown in FIG. 1, the scan chain 108 may be additionally configured to receive the functional data and the test pattern. During the functional mode, the functional data is stored in the scan chain 108 based on the fourth clock signal CLK4. In such a scenario, the fourth clock signal CLK4 corresponds to the divided version of the functional clock signal. During the shift phase, the test pattern is shifted through the scan chain 108 based on the fourth clock signal CLK4. In such a scenario, the fourth clock signal CLK4 corresponds to the test clock signal. Further, during the capture phase, the response RES of the IC 100 to the test pattern is captured based on the fourth clock signal CLK4. In such a scenario, the fourth clock signal CLK4 includes the first clock pulse and the second clock pulse. The captured response RES is then shifted out of the scan chain 108 based on the fourth clock signal CLK4 (e.g., the test clock signal).

The monitoring circuit 110 may be coupled to the testing system 104 and the scan chain 108. The monitoring circuit 110 may include suitable circuitry that may be configured to perform one or more operations. For example, the monitoring circuit 110 may be configured to receive the first and second output signals OT1 and OT2 from the testing system 104 and the captured response RES from the scan chain 108.

The monitoring circuit 110 may be further configured to determine the presence of the one or more faults in the clocking system 102 based on the first and second output signals OT1 and OT2. When the first output signal OT1 is asserted, the monitoring circuit 110 may determine the presence of the pipeline fault in the pipeline circuit 120. Similarly, when the second output signal OT2 is asserted, the monitoring circuit 110 may determine the presence of the division fault in at least one of the enabling circuit 118, the OCC 122, the first logic circuit 124, and the first clock gate 126. Further, the monitoring circuit 110 may be configured to compare the captured response RES with a predefined response (not shown) to detect the structural faults in the IC 100 (e.g., faults in the functional components of the IC 100).

A mismatch between the predefined response and the captured response RES may indicate the presence of structural faults in the IC 100 if the first and second output signals OT1 and OT2 are de-asserted. Similarly, a match between the predefined response and the captured response RES may indicate the absence of structural faults in the IC 100 if the first and second output signals OT1 and OT2 are de-asserted. However, if at least one of the first and second output signals OT1 and OT2 is asserted, the mismatch between the predefined response and the captured response RES may be a result of the one or more faults in the clocking system 102 instead of the structural faults in the functional components of the IC 100. Conversely, if at least one of the first and second output signals OT1 and OT2 is asserted, the match between the predefined response and the captured response RES may be a result of the one or more faults in the clocking system 102 and does not indicate the absence of the structural faults in the functional components of the IC 100.

Variations in the IC 100 of FIG. 1:

In a first variation, one of the pipeline fault and the division fault may be detected by the testing system 104, instead of detecting both the pipeline fault and the division fault.

In a second variation, the IC 100 may include more than one clocking system. In such a scenario, each additional clocking system may be coupled to a dedicated testing system and may be tested in a manner similar to the clocking system 102.

In a third variation, the clocking system 102 includes more than two clock generators for generating the functional clock signal, the test clock signal for the shift phase, and another clock signal for the capture phase.

In a fourth variation, the clocking system 102 may provide more than one clock signal to the scan chain 108. Each additional clock signal may be similar to the fourth clock signal CLK4.

In a fifth variation, some circuits may be located external to the IC 100. For example, in some embodiments, the first clock generator 112 and the second clock generator 114 may be external to the IC 100.

In a sixth variation, the clocking system 102 may include more than one OCC, more than one logic circuit, and more than one clock gate. In such a scenario, each additional OCC, logic circuit, and clock gate may operate in a manner similar to that of the OCC 122, the first logic circuit 124, and the first clock gate 126, respectively. Further, an additional testing system may be included on the IC 100 for each additional OCC, logic circuit, and clock gate.

In a seventh variation, the multiplexer 116 may be coupled between the first clock gate 126 and the scan chain 108. In such a scenario, the enabling circuit 118 and the OCC 122 may receive the second clock signal CLK2 and the clocking system 102 may be sans the second logic gate 130.

In an eighth variation, the IC 100 may include more than one scan chain. In such a scenario, an operation of each additional scan chain may be controlled in a manner similar to the scan chain 108.

Figure 2:
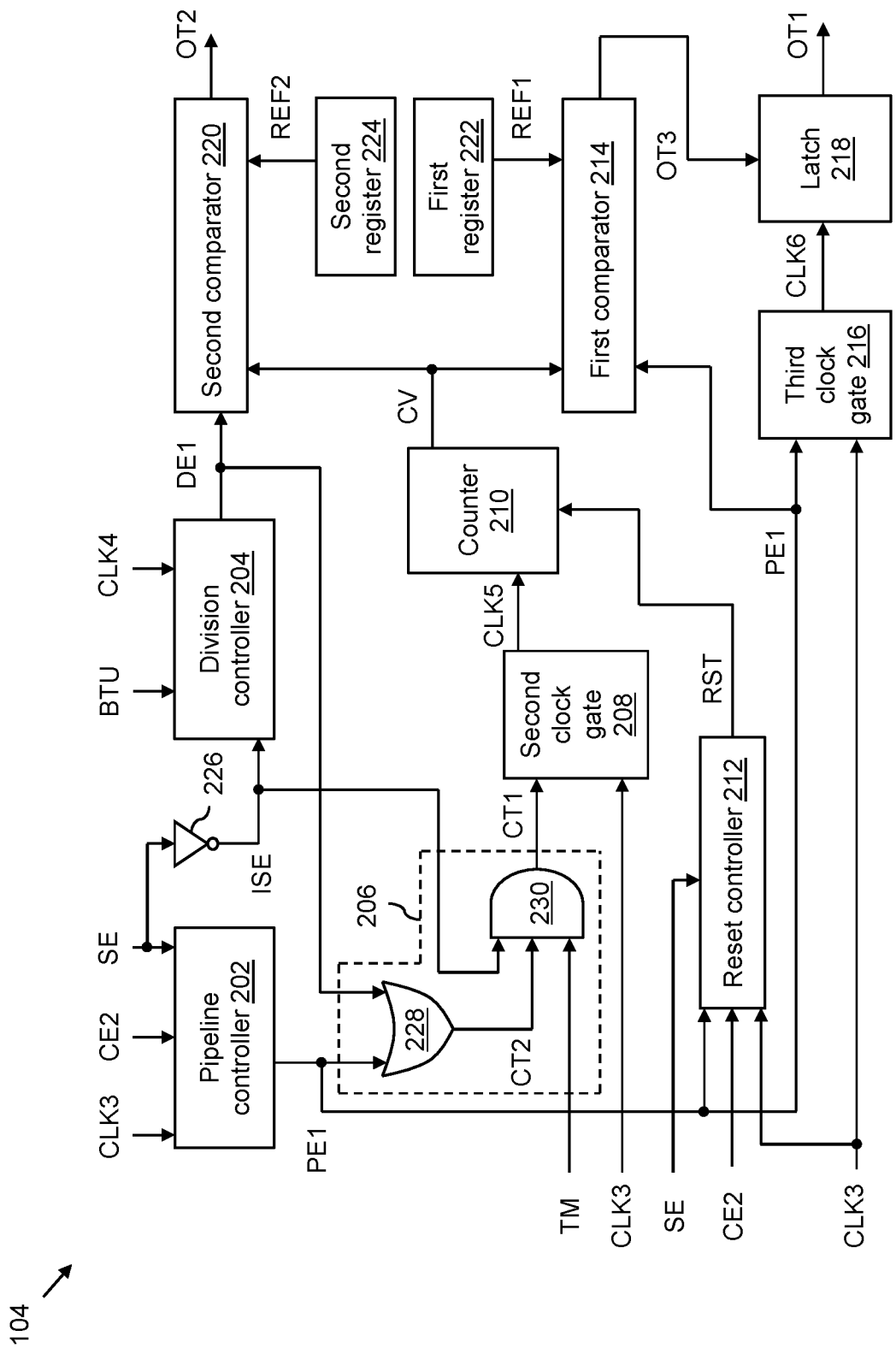
FIG. 2 illustrates a schematic block diagram of a testing system of the IC of FIG. 1 in accordance with an embodiment of the present disclosure.

FIG. 2 illustrates a schematic block diagram of the testing system 104 in accordance with an embodiment of the present disclosure. The testing system 104 may include a pipeline controller 202, a division controller 204, a second logic circuit 206, a second clock gate 208, a counter 210, a reset controller 212, a first comparator 214, a third clock gate 216, a latch 218, and a second comparator 220. The testing system 104 is operational during the capture phase and is non-operational during the shift phase and the functional mode.

The testing system 104 may further include a first register 222 and a second register 224 that may be configured to store the first and second reference values, respectively. The first and second reference values are hereinafter referred to and designated as "the first reference value REF1" and "the second reference value REF2", respectively. The first reference value REF1 is indicative of a desired count of clock pulses of the third clock signal CLK3 between the activation of the capture phase and the initial transition of the second clock enable signal CE2. Further, the second reference value REF2 is indicative of a desired count of clock pulses of the third clock signal CLK3 between the first and second clock pulses of the fourth clock signal CLK4.

The following table illustrates various signals and data described in FIG. 2:

| Signal/Data | Description |
| --- | --- |
| First pipeline enable signal PE1 | Indicative of a time duration between the activation of the capture phase and the initial transition of the second clock enable signal CE2 |
| First division enable signal DE1 | Indicative of a time duration between the first clock and second clock pulses |
| Inverted scan enable signal ISE | Inverted version of the scan enable signal SE |
| First counter enable signal CT1 | Controls the second clock gate 208 to facilitate the operation of the counter 210 |
| Second counter enable signal CT2 | Generated by performing an OR operation on the first pipeline enable signal PE1 and the first division enable signal DE1 |
| Fifth clock signal CLK5 | Gated version of the third clock signal CLK3 and generated for enabling the counter 210 |
| Count value CV | Indicative of the number of clock pulses of the third clock signal CLK3 counted by the counter 210 |
| Reset signal RST | Generated to reset the counter 210 |

| Signal/Data | Description |
| --- | --- |
| Third output signal OT3 | Indicative of a result of comparison between the count value CV and the first reference value REF1 |
| Sixth clock signal CLK6 | Gated version of the third clock signal CLK3 and generated for latching the third output signal OT3 when the first pipeline enable signal PE1 is de-asserted |

The pipeline controller 202 may be coupled to the clocking system 102 and the core circuit 106. The pipeline controller 202 may include suitable circuitry that may be configured to perform one or more operations. For example, the pipeline controller 202 may be configured to receive the third clock signal CLK3 and the second clock enable signal CE2 from the multiplexer 116 and the pipeline circuit 120 of the clocking system 102, respectively. The pipeline controller 202 may be further configured to receive the scan enable signal SE from the core circuit 106. Based on the third clock signal CLK3, the second clock enable signal CE2, and the scan enable signal SE, the pipeline controller 202 may be further configured to generate a first pipeline enable signal PE1.

During the shift phase, the scan enable signal SE is de-asserted and the pipeline controller 202 may be in a reset state. Further, based on the activation of the capture phase (e.g., the transition of the scan enable signal SE from the asserted state to the de-asserted state), the pipeline controller 202 may be out of the reset state. In such a scenario, the second clock enable signal CE2 is de-asserted and the first pipeline enable signal PE1 is asserted. Based on the delay introduced by the pipeline circuit 120, the second clock enable signal CE2 transitions from the de-asserted state to the asserted state during the capture phase. Further, during the capture phase, the first pipeline enable signal PE1 is de-asserted based on the assertion of the second clock enable signal CE2 and a transition of the third clock signal CLK3 from one logic state to another logic state (e.g., from the de-asserted state to the asserted state).

A time duration for which the first pipeline enable signal PE1 is asserted during the capture phase is indicative of the time duration between the activation of the capture phase and the initial transition of the second clock enable signal CE2 from the de-asserted state to the asserted state. The first count is thus determined based on the assertion of the first pipeline enable signal PE1 during the capture phase (e.g., the first count is indicative of the time duration for which the first pipeline enable signal PE1 is asserted during the capture phase). During the functional mode, the pipeline controller 202 may operate in a similar manner as described above. However, as the testing system 104 is non-operational during the functional mode, the first pipeline enable signal PE1 generated during the functional mode is not utilized for any operation in the testing system 104.

The division controller 204 may be coupled to the core circuit 106 and the clocking system 102. The division controller 204 may include suitable circuitry that may be configured to perform one or more operations. For example, the division controller 204 may be configured to receive the fourth clock signal CLK4 and the boot-up enable signal BTU from the clocking system 102 (e.g., the first clock gate 126) and the core circuit 106, respectively. Further, the testing system 104 may include a first inverter 226 that may be coupled to the core circuit 106, and configured to receive the scan enable signal SE and generate an inverted version of the scan enable signal SE (hereinafter referred to as the "inverted scan enable signal ISE"). The division controller 204 may be further coupled to the first inverter 226, and configured to receive the inverted scan enable signal ISE from the first inverter 226. Based on the fourth clock signal CLK4, the boot-up enable signal BTU, and the inverted scan enable signal ISE, the division controller 204 may be further configured to generate a first division enable signal DE1.

While the IC 100 is booting up, the boot-up enable signal BTU is asserted and the division controller 204 may be in a reset state. After the IC 100 is booted up, the boot-up enable signal BTU is de-asserted and the division controller 204 may be out of the reset state. In such a scenario, the first division enable signal DE1 is de-asserted. During the shift phase, the scan enable signal SE is asserted. In such a scenario, the first division enable signal DE1 remains de-asserted. Further, based on the activation of the capture phase, the first division enable signal DE1 is controlled based on the fourth clock signal CLK4. However, as the fourth clock signal CLK4 is de-asserted when the capture phase is activated, the first division enable signal DE1 remains de-asserted.

During the capture phase, the first division enable signal DE1 is asserted based on an assertion (e.g., a positive edge) of the first clock pulse of the fourth clock signal CLK4 and de-asserted based on an assertion (e.g., a positive edge) of the second clock pulse of the fourth clock signal CLK4. A time duration for which the first division enable signal DE1 is asserted during the capture phase is indicative of the time duration between the two clock pulses of the fourth clock signal CLK4. The second count is thus determined based on the assertion of the first division enable signal DE1 during the capture phase (e.g., the second count is indicative of the time duration for which the first division enable signal DE1 is asserted during the capture phase). During the functional mode, the division controller 204 may operate in a similar manner as described above. However, as the testing system 104 is non-operational during the functional mode, the first division enable signal DE1 generated during the functional mode is not utilized for any operation in the testing system 104.

Although it described that the first division enable signal DE1 is asserted based on the assertion of the first clock pulse and de-asserted based on the assertion of the second clock pulse, the scope of the present disclosure is not limited to it. In an alternate embodiment, during the capture phase, the first division enable signal DE1 is asserted based on a de-assertion (e.g., a negative edge) of the first clock pulse of the fourth clock signal CLK4 and de-asserted based on a de-assertion (e.g., a negative edge) of the second clock pulse of the fourth clock signal CLK4.

The second logic circuit 206 may be coupled to the pipeline controller 202, the division controller 204, the core circuit 106, and the first inverter 226. The second logic circuit 206 may be configured to receive the first pipeline enable signal PE1 and the first division enable signal DE1 from the pipeline controller 202 and the division controller 204, respectively. Further, the second logic circuit 206 may be configured to receive the inverted scan enable signal ISE and the test mode indicator signal TM from the first inverter 226 and the core circuit 106, respectively. Based on the first pipeline enable signal PE1, the first division enable signal DE1, the inverted scan enable signal ISE, and the test mode indicator signal TM, the second logic circuit 206 may be further configured to generate a first counter enable signal CT1. The first counter enable signal CT1 is asserted based on the assertion of the test mode indicator signal TM, the de-assertion of the scan enable signal SE, and the assertion of at least one of the first pipeline enable signal PE1 and the first division enable signal DE1. Further, the first counter enable signal CT1 is de-asserted based on the de-assertion of the test mode indicator signal TM, the assertion of the scan enable signal SE, or the de-assertion of each of the first pipeline enable signal PE1 and the first division enable signal DE1.

During the functional mode, the test mode indicator signal TM is de-asserted, and during the shift phase, the scan enable signal SE is asserted. Thus, the first counter enable signal CT1 is de-asserted during the functional mode and the shift phase of the at-speed testing mode. During the capture phase, the test mode indicator signal TM is asserted and the scan enable signal SE is de-asserted. Further, the first pipeline enable signal PE1 is asserted from the activation of the capture phase to the initial transition of the second clock enable signal CE2, whereas the first division enable signal DE1 is asserted from the assertion of the first clock pulse to the assertion of the second clock pulse. Thus, during the capture phase, the first counter enable signal CT1 is asserted from the activation of the capture phase to the initial transition of the second clock enable signal CE2, and from the assertion of the first clock pulse to the assertion of the second clock pulse. The first counter enable signal CT1 may be de-asserted for the remaining portions of the capture phase. The second logic circuit 206 may include a third logic gate 228 and a fourth logic gate 230.

The third logic gate 228 may be coupled to the pipeline controller 202 and the division controller 204. The third logic gate 228 may be configured to receive the first pipeline enable signal PE1 and the first division enable signal DE1 from the pipeline controller 202 and the division controller 204, respectively. Based on the first pipeline enable signal PE1 and the first division enable signal DE1, the third logic gate 228 may be further configured to generate a second counter enable signal CT2. In an embodiment, the third logic gate 228 is an OR gate. Thus, the second counter enable signal CT2 is asserted based on the assertion of at least one of the first pipeline enable signal PE1 and the first division enable signal DE1. Further, the second counter enable signal CT2 is de-asserted based on the de-assertion of each of the first pipeline enable signal PE1 and the first division enable signal DE1.

The fourth logic gate 230 may be coupled to the core circuit 106, the first inverter 226, and the third logic gate 228. The fourth logic gate 230 may be configured to receive the test mode indicator signal TM, the inverted scan enable signal ISE, and the second counter enable signal CT2 from the core circuit 106, the first inverter 226, and the third logic gate 228, respectively. Based on the test mode indicator signal TM, the inverted scan enable signal ISE, and the second counter enable signal CT2, the fourth logic gate 230 may be further configured to generate the first counter enable signal CT1. In an embodiment, the fourth logic gate 230 is an AND gate. Thus, the first counter enable signal CT1 is asserted based on the assertion of each of the inverted scan enable signal ISE, the test mode indicator signal TM, and the second counter enable signal CT2. Further, the first counter enable signal CT1 is de-asserted based on the de-assertion of at least one of the inverted scan enable signal ISE, the test mode indicator signal TM, and the second counter enable signal CT2.

The second clock gate 208 may be coupled to the second logic circuit 206, the counter 210, and the clocking system 102. The second clock gate 208 may be configured to receive the first counter enable signal CT1 from the second logic circuit 206, and the third clock signal CLK3 from the multiplexer 116 of the clocking system 102. Further, the second clock gate 208 may be configured to generate a fifth clock signal CLK5 based on the third clock signal CLK3 and the first counter enable signal CT1. The second clock gate 208 may be further configured to provide the fifth clock signal CLK5 to the counter 210 to facilitate the determination of the first and second counts during the capture phase.

The fifth clock signal CLK5 is de-asserted based on the de-assertion of the first counter enable signal CT1, and the fifth clock signal CLK5 is same as the third clock signal CLK3 based on the assertion of the first counter enable signal CT1. Thus, the fifth clock signal CLK5 is de-asserted during the functional mode and the shift phase of the testing mode. Further, during the capture phase, the fifth clock signal CLK5 is same as the third clock signal CLK3 from the activation of the capture phase to the initial transition of the second clock enable signal CE2, and from the assertion of the first clock pulse to the assertion of the second clock pulse.

The counter 210 may be coupled to the second clock gate 208 and the reset controller 212. The counter 210 may be configured to receive the fifth clock signal CLK5 from the second clock gate 208 and a reset signal RST from the reset controller 212. Further, the counter 210 may be configured to generate a count value CV based on the fifth clock signal CLK5 such that the count value CV is incremented for each clock pulse (e.g., for each positive edge or each negative edge) of the fifth clock signal CLK5. In other words, the fifth clock signal CLK5 controls an operation of the counter 210. Thus, a combination of the second logic circuit 206 and the second clock gate 208 ensures that the counter 210 is non-operational (e.g., the count value CV is zero) during the functional mode and the shift phase, thereby ensuring that the testing system 104 is non-operational during the functional mode and the shift phase.

During the capture phase, based on the assertion of the first pipeline enable signal PE1, the first counter enable signal CT1 is asserted and the fifth clock signal CLK5 is same as the third clock signal CLK3. The count value CV is thus incremented for each clock pulse of the fifth clock signal CLK5. The incrementation of the count value CV is halted when the first pipeline enable signal PE1 is de-asserted (e.g., when the first counter enable signal CT1 is de-asserted). Such a count value CV corresponds to the first count of clock pulses of the third clock signal CLK3 (e.g., the fifth clock signal CLK5). Based on the de-assertion of the first pipeline enable signal PE1, the counter 210 is reset. The reset signal RST is asserted to reset the counter 210. The first counter enable signal CT1 is then re-asserted based on the assertion of the first division enable signal DE1. In such a scenario, the fifth clock signal CLK5 is same as the third clock signal CLK3. The count value CV is thus incremented for each clock pulse of the fifth clock signal CLK5. The incrementation of the count value CV is halted when the first division enable signal DE1 is de-asserted (e.g., when the first counter enable signal CT1 is de-asserted). Such a count value CV corresponds to the second count of clock pulses of the third clock signal CLK3 (e.g., the fifth clock signal CLK5). The first and second counts facilitate the determination of the one or more faults in the clocking system 102.

The reset controller 212 may be coupled to the clocking system 102, the core circuit 106, the pipeline controller 202, and the counter 210. The reset controller 212 may be configured to receive the first pipeline enable signal PE1 from the pipeline controller 202, the third clock signal CLK3 and the second clock enable signal CE2 from the clocking system 102, and the scan enable signal SE from the core circuit 106. Based on the first pipeline enable signal PE1, the third clock signal CLK3, the second clock enable signal CE2, and the scan enable signal SE, the reset controller 212 may be further configured to generate the reset signal RST and provide the reset signal RST to the counter 210.

During the shift phase, the scan enable signal SE is asserted. In such a scenario, the reset signal RST is asserted and the counter 210 is reset. During the capture phase, the reset signal RST is de-asserted based on the assertion of the first pipeline enable signal PE1, and asserted based on the de-assertion of the first pipeline enable signal PE1. The reset signal RST thus ensures that the counter 210 is reset after the determination of the first count. The reset signal RST may then be de-asserted in the subsequent clock cycle of the third clock signal CLK3 to facilitate the determination of the second count. Further, the reset signal RST is asserted after the completion of the capture phase. During the functional mode, the reset controller 212 may operate in a similar manner as during the capture phase. However, the counter 210 does not perform any count operations as the fifth clock signal CLK5 remains de-asserted during the functional mode.

The first comparator 214 may be coupled to the counter 210, the pipeline controller 202, and the first register 222. The first comparator 214 may include suitable circuitry that may be configured to perform one or more operations. For example, the first comparator 214 may be configured to receive the count value CV and the first pipeline enable signal PE1 from the counter 210 and the pipeline controller 202, respectively. The first comparator 214 may be further configured to receive the first reference value REF1 from the first register 222. The first pipeline enable signal PE1 controls the operation of the first comparator 214. In an embodiment, the first comparator 214 is deactivated based on the de-assertion of the first pipeline enable signal PE1. Further, the first comparator 214 is activated based on the assertion of the first pipeline enable signal PE1. Thus, the first comparator 214 is activated between the activation of the capture phase and the initial transition of the second clock enable signal CE2 from the de-asserted state to the asserted state.

When the first comparator 214 is activated, the first comparator 214 may be further configured to compare the count value CV with the first reference value REF1. The comparison operation is continuous while the first pipeline enable signal PE1 remains asserted. The first comparator 214 may be further configured to detect the fault in the clocking system 102 based on the comparison of the count value CV with the first reference value REF1, and generate a third output signal OT3 indicative of the detected fault. In such a scenario, the fault corresponds to the pipeline fault in the pipeline circuit 120. When the count value CV is different from the first reference value REF1, the third output signal OT3 is asserted. Conversely, when the count value CV is same as the first reference value REF1, the third output signal OT3 is de-asserted. As the comparison operation is continuous, the time instance at which the first pipeline enable signal PE1 is de-asserted (e.g., the count value CV is equal to the first count) provides an accurate detection of the fault. In other words, the first comparator 214 may compare the first count with the first reference value REF1, detect the fault in the clocking system 102 based on the comparison of the first count with the first reference value REF1, and generate the third output signal OT3 indicative of the detected fault. The third output signal OT3 at such a time instance is latched in the latch 218 based on the third clock signal CLK3. The logic state of the latched third output signal OT3 thus indicates whether the clocking system 102 is faulty.

Although it is described that the first comparator 214 receives the first reference value REF1 from the first register 222, the scope of the present disclosure is not limited to it. In various other embodiments, the first reference value REF1 may be hardcoded in the first comparator 214.

The third clock gate 216 may be coupled to clocking system 102 (e.g., the multiplexer 116) and the pipeline controller 202. The third clock gate 216 may be configured to receive the first pipeline enable signal PE1 and the third clock signal CLK3 from the pipeline controller 202 and the multiplexer 116, respectively. Based on the first pipeline enable signal PE1 and the third clock signal CLK3, the third clock gate 216 may be further configured to generate a sixth clock signal CLK6. The sixth clock signal CLK6 may be same as the third clock signal CLK3 based on the assertion of the first pipeline enable signal PE1. Further, the sixth clock signal CLK6 may be de-asserted based on the de-assertion of the first pipeline enable signal PE1.

The latch 218 may be coupled to the first comparator 214, the third clock gate 216, and the monitoring circuit 110. The latch 218 may be configured to receive the third output signal OT3 and the sixth clock signal CLK6 from the first comparator 214 and the third clock gate 216, respectively. Further, the latch 218 may be configured to generate the first output signal OT1 based on the third output signal OT3 and the sixth clock signal CLK6, and provide the first output signal OT1 to the monitoring circuit 110. The first output signal OT1 is same as the third output signal OT3 based on an assertion of the sixth clock signal CLK6.

When the first pipeline enable signal PE1 is asserted, the sixth clock signal CLK6 is same as the third clock signal CLK3. The sixth clock signal CLK6 thus includes various clock pulses, and the first output signal OT1 is same as the third output signal OT3 when each such clock pulse is asserted. When the first pipeline enable signal PE1 is de-asserted, the sixth clock signal CLK6 is de-asserted. In such a scenario, a logic state of the first output signal OT1 is retained. The first output signal OT1 is thus indicative of the third output signal OT3 when the first pipeline enable signal PE1 transitions from the asserted state to the de-asserted state. In other words, the first output signal OT1 corresponds to a latched version of the third output signal OT3 based on the de-assertion of the first pipeline enable signal PE1. Further, the first output signal OT1 is indicative of the presence or absence of the pipeline fault in the pipeline circuit 120 of the clocking system 102.

The second comparator 220 may be coupled to the counter 210, the division controller 204, and the second register 224. The second comparator 220 may include suitable circuitry that may be configured to perform one or more operations. For example, the second comparator 220 may be configured to receive the count value CV and the first division enable signal DE1 from the counter 210 and the division controller 204, respectively. The second comparator 220 may be further configured to receive the second reference value REF2 from the second register 224. The first division enable signal DE1 controls the operation of the second comparator 220. In an embodiment, the second comparator 220 is deactivated based on the de-assertion of the first division enable signal DE1. Further, the second comparator 220 is activated based on the assertion of the first division enable signal DE1. Thus, the second comparator 220 is activated between the first and second clock pulses of the fourth clock signal CLK4.

When the second comparator 220 is activated, the second comparator 220 may be further configured to compare the count value CV with the second reference value REF2. The comparison operation is continuous while the first division enable signal DE1 remains asserted. The second comparator 220 may be further configured to detect the fault in the clocking system 102 based on the comparison of the count value CV with the second reference value REF2, and generate the second output signal OT2 indicative of the detected fault. In such a scenario, the fault corresponds to the division fault in at least one of the enabling circuit 118, the OCC 122, the first logic circuit 124, and the first clock gate 126. When the count value CV is different from the second reference value REF2, the second output signal OT2 is asserted. Conversely, when the count value CV is same as the second reference value REF2, the second output signal OT2 is de-asserted. As the comparison operation is continuous, the time instance at which the first division enable signal DE1 is de-asserted (e.g., the count value CV is equal to the second count) provides an accurate detection of the fault. In other words, the second comparator 220 may compare the second count with the second reference value REF2, detect the fault in the clocking system 102 based on the comparison of the second count with the second reference value REF2, and generate the second output signal OT2 indicative of the detected fault. The logic state of the second output signal OT2 thus indicates whether the clocking system 102 is faulty.

Although it is described that the second comparator 220 receives the second reference value REF2 from the second register 224, the scope of the present disclosure is not limited to it. In various other embodiments, the second reference value REF2 may be hardcoded in the second comparator 220.

The scope of the present disclosure is not limited to the clocking system 102 including the enabling circuit 118 and the pipeline circuit 120. In various other embodiments, the clocking system 102 may be sans the enabling circuit 118 and the pipeline circuit 120, without deviating from the scope of the present disclosure. In such a scenario, the first reference value REF1 may be equal to zero.

FIG. 3 illustrates a schematic circuit diagram of the pipeline controller 202 in accordance with an embodiment of the present disclosure. The pipeline controller 202 may include a fifth logic gate 302, a fourth clock gate 304, a first flip-flop 306, and a second inverter 308.

The fifth logic gate 302 may be coupled to the clocking system 102 (e.g., the pipeline circuit 120) and the second inverter 308. The fifth logic gate 302 may be configured to receive the second clock enable signal CE2 and the first pipeline enable signal PE1 from the pipeline circuit 120 and the second inverter 308, respectively. Based on the second clock enable signal CE2 and the first pipeline enable signal PE1, the fifth logic gate 302 may be further configured to generate a second pipeline enable signal PE2. In an embodiment, the fifth logic gate 302 is an AND gate. Thus, the second pipeline enable signal PE2 is asserted based on the assertion of each of the second clock enable signal CE2 and the first pipeline enable signal PE1. Further, the second pipeline enable signal PE2 is de-asserted based on the de-assertion of at least one of the first pipeline enable signal PE1 and the second clock enable signal CE2.

The fourth clock gate 304 may be coupled to the clocking system 102 (e.g., the multiplexer 116), the fifth logic gate 302, and the first flip-flop 306. The fourth clock gate 304 may be configured to receive the third clock signal CLK3 and the second pipeline enable signal PE2 from the multiplexer 116 and the fifth logic gate 302, respectively. Further, the fourth clock gate 304 may be configured to generate a seventh clock signal CLK7 based on the third clock signal CLK3 and the second pipeline enable signal PE2, and provide the seventh clock signal CLK7 to the first flip-flop 306. The seventh clock signal CLK7 is de-asserted based on the de-assertion of the second pipeline enable signal PE2. Further, the seventh clock signal CLK7 transitions from one logic state to another logic state based on the assertion of the second pipeline enable signal PE2 and the transition of the third clock signal CLK3 from one logic state to another logic state. In other words, the seventh clock signal CLK7 is same as the third clock signal CLK3 based on the assertion of the second pipeline enable signal PE2.

The first flip-flop 306 may be coupled to the fourth clock gate 304, the second inverter 308, and the core circuit 106. The first flip-flop 306 may be configured to receive the seventh clock signal CLK7, the first pipeline enable signal PE1, and the scan enable signal SE from the fourth clock gate 304, the second inverter 308, and the core circuit 106, respectively. In an embodiment, the seventh clock signal CLK7, the first pipeline enable signal PE1, and the scan enable signal SE are received at a clock terminal, a data terminal, and a control terminal of the first flip-flop 306, respectively. The first flip-flop 306 may be further configured to generate a third pipeline enable signal PE3 based on the scan enable signal SE, the first pipeline enable signal PE1, and the seventh clock signal CLK7. Based on the assertion of the scan enable signal SE, the first flip-flop 306 is in the reset state. Thus, the third pipeline enable signal PE3 may be de-asserted or asserted. Further, the third pipeline enable signal PE3 is same as the first pipeline enable signal PE1 based on the de-assertion of the scan enable signal SE and the transition of the seventh clock signal CLK7 from one logic state to another logic state.

The first flip-flop 306 may be a positive edge-triggered flip-flop or a negative edge-triggered flip-flop. For the sake of ongoing discussion, it is assumed that the first flip-flop 306 is a positive edge-triggered flip-flop. Thus, the third pipeline enable signal PE3 is same as the first pipeline enable signal PE1 when the seventh clock signal CLK7 transitions from the de-asserted state to the asserted state and the scan enable signal SE is de-asserted.

The second inverter 308 may be coupled to the first flip-flop 306, the fifth logic gate 302, the second logic circuit 206, the reset controller 212, the third clock gate 216, and the first comparator 214. The second inverter 308 may be configured to receive the third pipeline enable signal PE3 from the first flip-flop 306 and generate the first pipeline enable signal PE1 as an inverted version of the third pipeline enable signal PE3. Further, the second inverter 308 may be configured to provide the first pipeline enable signal PE1 to the first flip-flop 306, the fifth logic gate 302, the second logic circuit 206, the reset controller 212, the third clock gate 216, and the first comparator 214.

During the shift phase, the scan enable signal SE is asserted. The first flip-flop 306 is thus in the reset state. The transition of the scan enable signal SE from the asserted state to the de-asserted state is indicative of the activation of the capture phase. Based on the activation of the capture phase, the third pipeline enable signal PE3 is de-asserted. As a result, the first pipeline enable signal PE1 is asserted. The counter 210 thus starts counting the clock pulses of the third clock signal CLK3. The second clock enable signal CE2 is de-asserted when the capture phase is activated. Thus, the second pipeline enable signal PE2 and the seventh clock signal CLK7 are de-asserted when the capture phase is activated.

During the capture phase, the second clock enable signal CE2 transitions from the de-asserted state to the asserted state. The delay between the activation of the capture phase and the transition of the second clock enable signal CE2 is introduced by the pipeline circuit 120. As the second clock enable signal CE2 and the first pipeline enable signal PE1 are asserted, the second pipeline enable signal PE2 is asserted. Consequently, the seventh clock signal CLK7 is same as the third clock signal CLK3. Further, based on the transition of the third clock signal CLK3 (e.g., the seventh clock signal CLK7) from one logic state to another logic state, the third pipeline enable signal PE3 is asserted and the first pipeline enable signal PE1 is de-asserted. The counter 210 is reset based on the de-assertion of the first pipeline enable signal PE1. The pipeline controller 202 thus facilitates the counting of clock pulses of the third clock signal CLK3 between the activation of the capture phase and the transition of the second clock enable signal CE2.

FIG. 4 illustrates a schematic circuit diagram of the division controller 204 in accordance with an embodiment of the present disclosure. The division controller 204 may include a fifth clock gate 402, a second flip-flop 404, and a third inverter 406.

The fifth clock gate 402 may be coupled to the clocking system 102 (e.g., the first clock gate 126), the first inverter 226, and the second flip-flop 404. The fifth clock gate 402 may be configured to receive the fourth clock signal CLK4 and the inverted scan enable signal ISE from the first clock gate 126 and the first inverter 226, respectively. Further, the fifth clock gate 402 may be configured to generate an eighth clock signal CLK8 based on the fourth clock signal CLK4 and the inverted scan enable signal ISE, and provide the eighth clock signal CLK8 to the second flip-flop 404. The eighth clock signal CLK8 is de-asserted based on the de-assertion of the inverted scan enable signal ISE (e.g., the assertion of the scan enable signal SE). Further, the eighth clock signal CLK8 transitions from one logic state to another logic state based on the assertion of the inverted scan enable signal ISE and the transition of the fourth clock signal CLK4 from one logic state to another logic state. In other words, the eighth clock signal CLK8 is same as the fourth clock signal CLK4 based on the assertion of the inverted scan enable signal ISE (e.g., the de-assertion of the scan enable signal SE).

The second flip-flop 404 may be coupled to the fifth clock gate 402, the third inverter 406, and the core circuit 106. The second flip-flop 404 may be configured to receive the eighth clock signal CLK8, the first division enable signal DE1, and the boot-up enable signal BTU from the fifth clock gate 402, the third inverter 406, and the core circuit 106, respectively. In an embodiment, the eighth clock signal CLK8, the first division enable signal DE1, and the boot-up enable signal BTU are received at a clock terminal, a data terminal, and a control terminal of the second flip-flop 404, respectively. The second flip-flop 404 may be further configured to generate a second division enable signal DE2 based on the boot-up enable signal BTU, the first division enable signal DE1, and the eighth clock signal CLK8. During the boot-up of the IC 100, the boot-up enable signal BTU is asserted. Based on the assertion of the boot-up enable signal BTU, the second flip-flop 404 is in the reset state (e.g., the second division enable signal DE2 is asserted). Further, the second division enable signal DE2 is same as the first division enable signal DE1 based on the de-assertion of the boot-up enable signal BTU and the transition of the eighth clock signal CLK8 from one logic state to another logic state.

The second flip-flop 404 may be a positive edge-triggered flip-flop or a negative edge-triggered flip-flop. For the sake of ongoing discussion, it is assumed that the second flip-flop 404 is a positive edge-triggered flip-flop. Thus, the second division enable signal DE2 is same as the first division enable signal DE1 when the eighth clock signal CLK8 transitions from the de-asserted state to the asserted state and the boot-up enable signal BTU is de-asserted.

The third inverter 406 may be coupled to the second flip-flop 404, the second comparator 220, and the second logic circuit 206. The third inverter 406 may be configured to receive the second division enable signal DE2 from the second flip-flop 404 and generate the first division enable signal DE1 as an inverted version of the second division enable signal DE2. Further, the third inverter 406 may be configured to provide the first division enable signal DE1 to the second flip-flop 404, the second comparator 220, and the second logic circuit 206.

During the boot-up of the IC 100, the boot-up enable signal BTU is asserted. Thus, the second flip-flop 404 is in the reset state. After the IC 100 is booted up, the boot-up enable signal BTU is de-asserted. In such a scenario, the second division enable signal DE2 is asserted and the first division enable signal DE1 is de-asserted. During the shift phase, the scan enable signal SE is asserted (e.g., the inverted scan enable signal ISE is de-asserted). The eighth clock signal CLK8 is thus de-asserted, and the logic state of the second division enable signal DE2 is retained.

The transition of the scan enable signal SE from the asserted state to the de-asserted state is indicative of the activation of the capture phase. Based on the activation of the capture phase, the fifth clock gate 402 is activated and the eighth clock signal CLK8 is same as the fourth clock signal CLK4. As the fourth clock signal CLK4 is de-asserted during the activation of the capture phase, the eighth clock signal CLK8 is de-asserted and the logic state of the second division enable signal DE2 is retained. Further, during the capture phase, based on the assertion of the first clock pulse of the fourth clock signal CLK4, the eighth clock signal CLK8 transitions. In other words, the first clock pulse of the fourth clock signal CLK4 results in a clock pulse of the eighth clock signal CLK8. The transition of the eighth clock signal CLK8 from the de-asserted state to the asserted state results in the de-assertion of the second division enable signal DE2 and the assertion of the first division enable signal DE1. The counter 210 thus starts counting the clock pulses of the third clock signal CLK3. Further, based on the assertion of the second clock pulse of the fourth clock signal CLK4, the eighth clock signal CLK8 transitions and results in the assertion of the second division enable signal DE2 and the de-assertion of the first division enable signal DE1. The counter 210 is halted after the de-assertion of the first division enable signal DE1. The division controller 204 thus facilitates the counting of the clock pulses of the third clock signal CLK3 between the assertion of the first clock pulse and the assertion of the second clock pulse.

Figure 5:
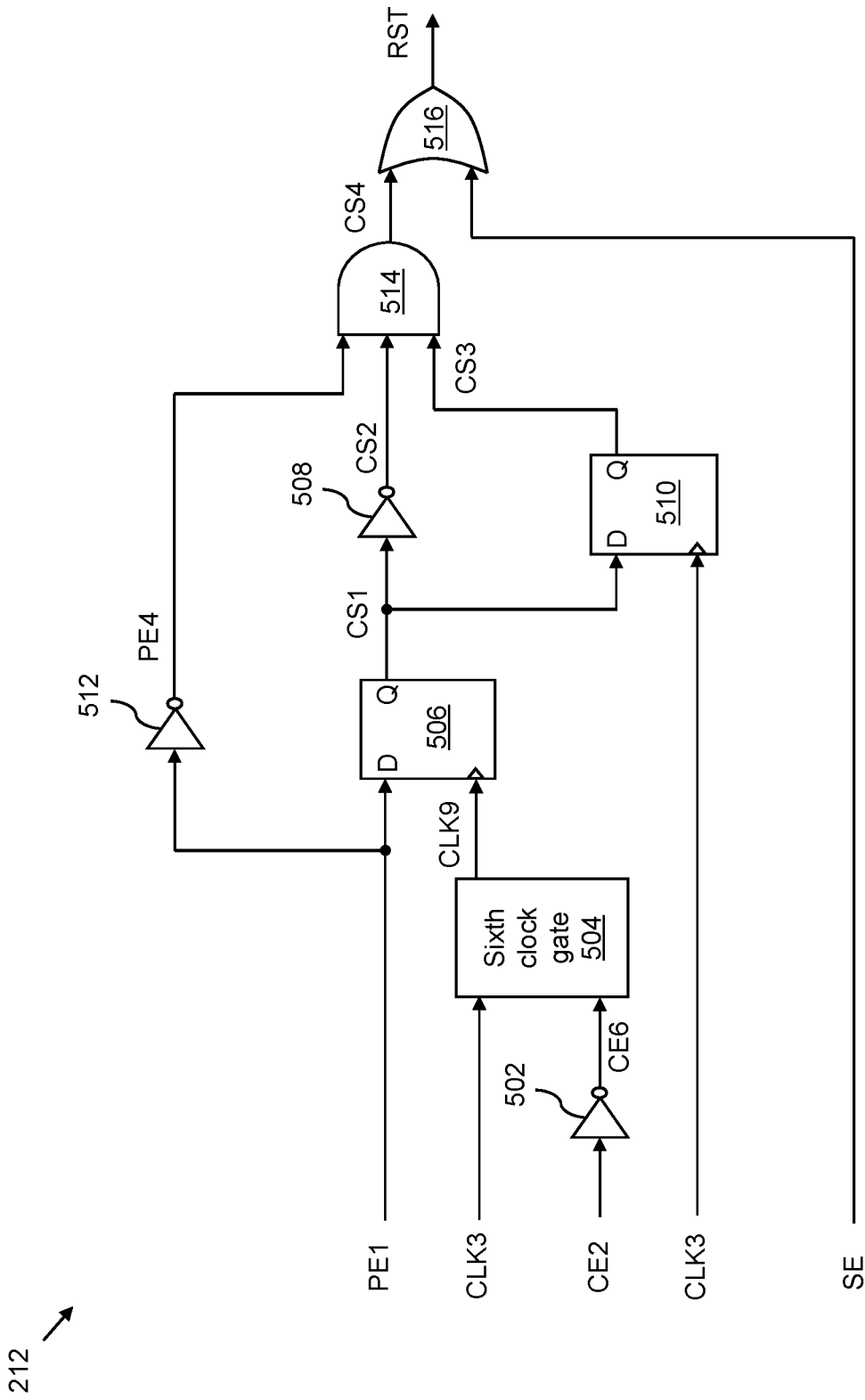
FIG. 5 illustrates a schematic circuit diagram of a reset controller of the testing system of FIG. 2 in accordance with an embodiment of the present disclosure.

FIG. 5 illustrates a schematic circuit diagram of the reset controller 212 in accordance with an embodiment of the present disclosure. The reset controller 212 may include a fourth inverter 502, a sixth clock gate 504, a third flip-flop 506, a fifth inverter 508, a fourth flip-flop 510, and a sixth inverter 512. The reset controller 212 may further include a sixth logic gate 514 and a seventh logic gate 516.

The fourth inverter 502 may be coupled to the clocking system 102 (e.g., the pipeline circuit 120). The fourth inverter 502 may be configured to receive the second clock enable signal CE2 from the pipeline circuit 120 and generate a sixth clock enable signal CE6 as an inverted version of the second clock enable signal CE2.

The sixth clock gate 504 may be coupled to the clocking system 102 (e.g., the multiplexer 116), the fourth inverter 502, and the third flip-flop 506. The sixth clock gate 504 may be configured to receive the third clock signal CLK3 and the sixth clock enable signal CE6 from the multiplexer 116 and the fourth inverter 502, respectively. Further, the sixth clock gate 504 may be configured to generate a ninth clock signal CLK9 based on the third clock signal CLK3 and the sixth clock enable signal CE6, and provide the ninth clock signal CLK9 to the third flip-flop 506. The ninth clock signal CLK9 is de-asserted based on a de-assertion of the sixth clock enable signal CE6 (e.g., the assertion of the second clock enable signal CE2). Further, the ninth clock signal CLK9 transitions from one logic state to another logic state based on an assertion of the sixth clock enable signal CE6 and the transition of the third clock signal CLK3 from one logic state to another logic state. In other words, the ninth clock signal CLK9 is same as the third clock signal CLK3 based on the assertion of the sixth clock enable signal CE6 (e.g., the de-assertion of the second clock enable signal CE2).

The third flip-flop 506 may be coupled to the sixth clock gate 504 and the pipeline controller 202. The third flip-flop 506 may be configured to receive the ninth clock signal CLK9 and the first pipeline enable signal PE1 from the sixth clock gate 504 and pipeline controller 202, respectively. In an embodiment, the ninth clock signal CLK9 and the first pipeline enable signal PE1 are received at a clock terminal and a data terminal of the third flip-flop 506, respectively. The third flip-flop 506 may be further configured to generate a first control signal CS1 based on the first pipeline enable signal PE1 and the ninth clock signal CLK9. Based on the transition of the ninth clock signal CLK9 from one logic state to another logic state, the first control signal CS1 is same as the first pipeline enable signal PE1. The third flip-flop 506 may be a positive edge-triggered flip-flop or a negative edge-triggered flip-flop. For the sake of ongoing discussion, it is assumed that the third flip-flop 506 is a positive edge-triggered flip-flop. Thus, the first control signal CS1 is same as the first pipeline enable signal PE1 when the ninth clock signal CLK9 transitions from the de-asserted state to the asserted state.

The fifth inverter 508 may be coupled to the third flip-flop 506. The fifth inverter 508 may be configured to receive the first control signal CS1 from the third flip-flop 506 and generate a second control signal CS2 as an inverted version of the first control signal CS1.

The fourth flip-flop 510 may be coupled to the third flip-flop 506 and the clocking system 102 (e.g., the multiplexer 116). The fourth flip-flop 510 may be configured to receive the third clock signal CLK3 and the first control signal CS1 from the multiplexer 116 and the third flip-flop 506, respectively. In an embodiment, the third clock signal CLK3 and the first control signal CS1 are received at a clock terminal and a data terminal of the fourth flip-flop 510, respectively. The fourth flip-flop 510 may be further configured to generate a third control signal CS3 based on the first control signal CS1 and the third clock signal CLK3. Based on the transition of the third clock signal CLK3 from one logic state to another logic state, the third control signal CS3 is same as the first control signal CS1. The fourth flip-flop 510 may be a positive edge-triggered flip-flop or a negative edge-triggered flip-flop. For the sake of ongoing discussion, it is assumed that the fourth flip-flop 510 is a positive edge-triggered flip-flop. Thus, the third control signal CS3 is same as the first control signal CS1 when the third clock signal CLK3 transitions from the de-asserted state to the asserted state.

The sixth inverter 512 may be coupled to the pipeline controller 202. The sixth inverter 512 may be configured to receive the first pipeline enable signal PE1 from the pipeline controller 202 and generate a fourth pipeline enable signal PE4 as an inverted version of the first pipeline enable signal PE1.

The sixth logic gate 514 may be coupled to the fifth and sixth inverters 508 and 512 and the fourth flip-flop 510. The sixth logic gate 514 may be configured to receive the fourth pipeline enable signal PE4, the second control signal CS2, and the third control signal CS3 from the sixth inverter 512, the fifth inverter 508, and the fourth flip-flop 510, respectively. Based on the fourth pipeline enable signal PE4 and the second and third control signals CS2 and CS3, the sixth logic gate 514 may be further configured to generate a fourth control signal CS4. In an embodiment, the sixth logic gate 514 is an AND gate. Thus, the fourth control signal CS4 is asserted based on an assertion of the fourth pipeline enable signal PE4 (e.g., the de-assertion of the first pipeline enable signal PE1), an assertion of the second control signal CS2, and an assertion of the third control signal CS3. Further, the fourth control signal CS4 is de-asserted based on at least one of a de-assertion of the fourth pipeline enable signal PE4 (e.g., the assertion of the first pipeline enable signal PE1), a de-assertion of the second control signal CS2, and a de-assertion of the third control signal CS3.

The seventh logic gate 516 may be coupled to the sixth logic gate 514, the core circuit 106, and the counter 210. The seventh logic gate 516 may be configured to receive the fourth control signal CS4 and the scan enable signal SE from the sixth logic gate 514 and the core circuit 106, respectively. Based on the scan enable signal SE and the fourth control signal CS4, the seventh logic gate 516 may be further configured to generate the reset signal RST. In an embodiment, the seventh logic gate 516 is an OR gate. Thus, the reset signal RST is de-asserted based on the de-assertion of each of the scan enable signal SE and the fourth control signal CS4. Further, the reset signal RST is asserted based on the assertion of at least one of the fourth control signal CS4 and the scan enable signal SE.

During the shift phase, the scan enable signal SE is asserted. As a result, the reset signal RST is asserted. The transition of the scan enable signal SE from the asserted state to the de-asserted state is indicative of the activation of the capture phase. In such a scenario, the reset signal RST is same as the fourth control signal CS4. Based on the activation of the capture phase, the first pipeline enable signal PE1 is asserted and the second clock enable signal CE2 is de-asserted. Thus, based on the transition of the third clock signal CLK3, the first control signal CS1 is asserted and the second control signal CS2 is de-asserted. Further, the fourth pipeline enable signal PE4 is de-asserted based on the assertion of the first pipeline enable signal PE1. The fourth control signal CS4, and in turn, the reset signal RST are thus de-asserted based on the activation of the capture phase.

During the capture phase, the second clock enable signal CE2 is asserted after a lapse of the pipeline delay. As a result, the first pipeline enable signal PE1 is de-asserted based on the transition of the third clock signal CLK3. As the first pipeline enable signal PE1 is de-asserted, the fourth pipeline enable signal PE4 is asserted. However, the sixth clock gate 504 is deactivated based on the assertion of the second clock enable signal CE2. Hence, the first and second control signals CS1 and CS2 remain asserted and de-asserted, respectively. When the second clock enable signal CE2 is subsequently de-asserted, the sixth clock gate 504 is activated (e.g., the ninth clock signal CLK9 is same as the third clock signal CLK3). In such a scenario, based on the transition of the ninth clock signal CLK9, the first control signal CS1 is de-asserted and the second control signal CS2 is asserted. Further, until the third clock signal CLK3 transitions in the subsequent clock cycle, the third control signal CS3 remains asserted. As a result, the fourth control signal CS4 and the reset signal RST are asserted, and the counter 210 is reset. Further, when the third clock signal CLK3 transitions, the third control signal CS3 is de-asserted based on the de-assertion of the first control signal CS1. As a result, the fourth control signal CS4 and the reset signal RST are de-asserted, and the counter 210 is available for counting the clock pulses of the third clock signal CLK3 between the first and second clock pulses of the fourth clock signal CLK4.

Figure 6:
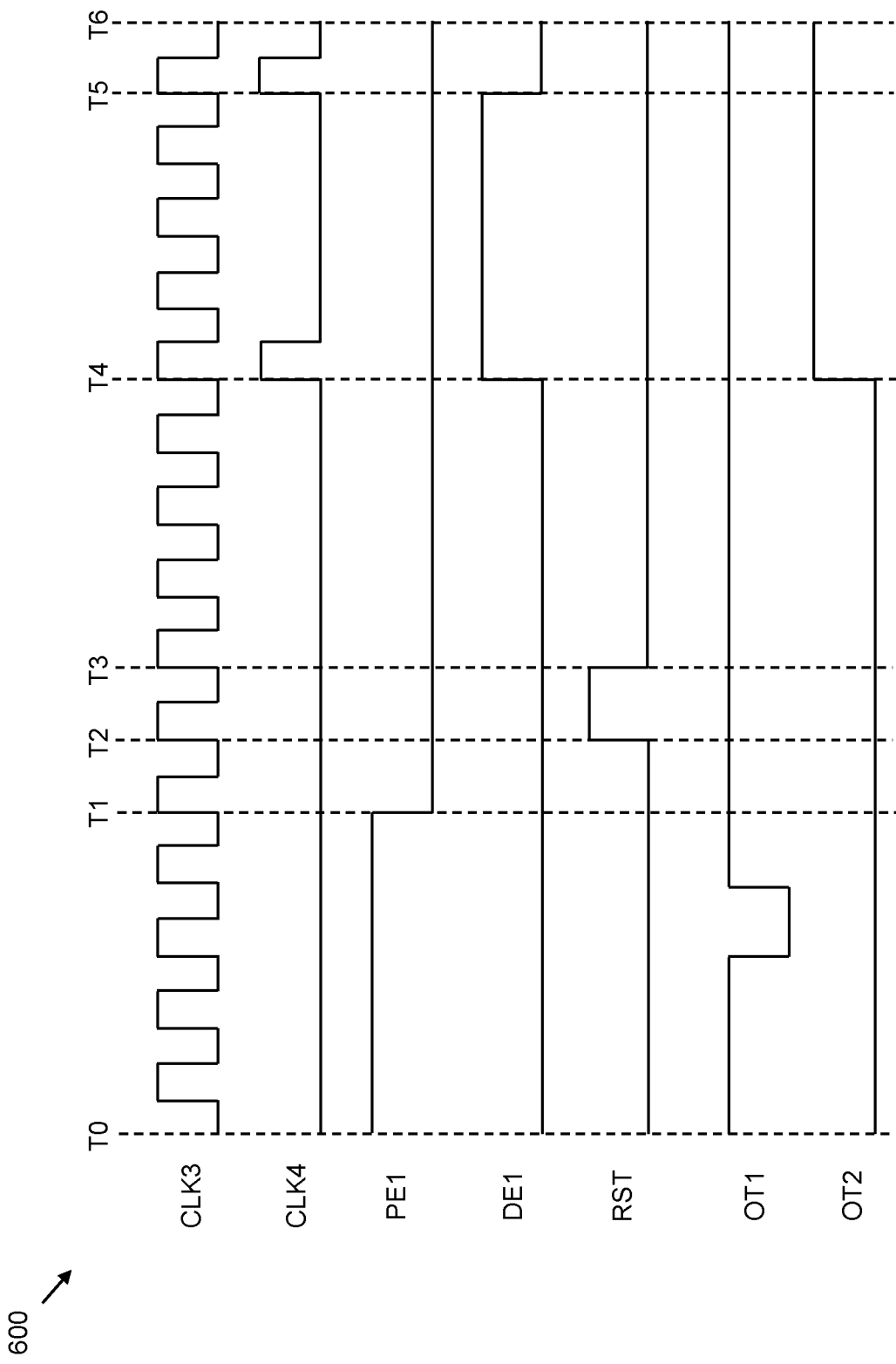
FIG. 6 represents a timing diagram that illustrates an operation of the testing system of FIG. 2 in accordance with an embodiment of the present disclosure.

FIG. 6 represents a timing diagram 600 that illustrates an operation of the testing system 104 in accordance with an embodiment of the present disclosure. The testing system 104 may receive the third clock signal CLK3, the fourth clock signal CLK4, the scan enable signal SE, and the second clock enable signal CE2. During the capture phase, the scan enable signal SE is de-asserted. Further, the testing system 104 may be configured to generate the first output signal OT1 and the second output signal OT2 that are indicative of the one or more faults detected in the clocking system 102. To facilitate the detection of the one or more faults in the clocking system 102, the first pipeline enable signal PE1, the first division enable signal DE1, and the reset signal RST are generated by the pipeline controller 202, the division controller 204, and the reset controller 212 of the testing system 104, respectively.

At time instance T0, the scan enable signal SE transitions from the asserted state to the de-asserted state. In other words, the capture phase is activated at the time instance T0. Further, based on the activation of the capture phase, the first pipeline enable signal PE1 is asserted and the second clock enable signal CE2 is de-asserted. Thus, the counter 210 starts counting the clock pulses of the third clock signal CLK3 at the time instance T0.

During a time period T0-T1, the third clock signal CLK3 toggles between the asserted and de-asserted states (e.g., completes multiple clock cycles). As the second clock enable signal CE2 is de-asserted, the fourth clock enable signal CE4 is de-asserted. The de-assertion of the fourth clock enable signal CE4 results in the de-assertion of the fourth clock signal CLK4 during the time period T0-T1. As the fourth clock signal CLK4 is de-asserted, the first division enable signal DE1 is de-asserted. Thus, the second comparator 220 is deactivated and the second output signal OT2 is de-asserted. Further, the reset signal RST is de-asserted. The first pipeline enable signal PE1 remains asserted, thereby facilitating the counting operations of the counter 210. The count value CV generated by the counter 210 is compared with the first reference value REF1 to enable the generation of the first output signal OT1. For the sake of ongoing discussion, it is assumed that the first reference value REF1 is three. Thus, the first output signal OT1 is asserted during the initial two clock pulses of the third clock signal CLK3, and de-asserted during a third clock pulse of the third clock signal CLK3. As the first pipeline enable signal PE1 remains asserted beyond the three clock pulses of the third clock signal CLK3, the count value CV is incremented to four. As the count value CV is different from the first reference value REF1, the first output signal OT1 is asserted during a fourth clock pulse of the third clock signal CLK3 and remains asserted during the remainder of the time period T0-T1.

At time instance T1, the third clock signal CLK3 transitions from the de-asserted state to the asserted state, and the first pipeline enable signal PE1 transitions from the asserted state to the de-asserted state. The first pipeline enable signal PE1 transitions in response to the assertion of the second clock enable signal CE2. Further, the first output signal OT1 retains a previous logic state. In other words, the first output signal OT1 remains asserted. The fourth clock signal CLK4 remains de-asserted at the time instance T1. As a result, the first division enable signal DE1 and the second output signal OT2 remain de-asserted. Further, the reset signal RST remains de-asserted at the time instance T1.

During a time period T1-T2, the third clock signal CLK3 completes one clock cycle. The fourth clock signal CLK4, the first pipeline enable signal PE1, the first division enable signal DE1, the reset signal RST, and the second output signal OT2 remain de-asserted and the first output signal OT1 remains asserted.

At time instance T2, the third clock signal CLK3 transitions from the de-asserted state to the asserted state. As a result, the reset signal RST transitions from the de-asserted state to the asserted state, and the counter 210 is reset. The reset signal RST transitions in response to the de-assertion of the first pipeline enable signal PE1 and in synchronization with the third clock signal CLK3. The fourth clock signal CLK4, the first pipeline enable signal PE1, the first division enable signal DE1, and the second output signal OT2 remain de-asserted and the first output signal OT1 remains asserted at the time instance T2.

During a time period T2-T3, the third clock signal CLK3 completes one clock cycle, and the reset signal RST remains asserted. Thus, the counter 210 is in the reset state. Further, the fourth clock signal CLK4, the first pipeline enable signal PE1, the first division enable signal DE1, and the second output signal OT2 remain de-asserted and the first output signal OT1 remains asserted.

At time instance T3, the third clock signal CLK3 transitions from the de-asserted state to the asserted state. As a result, the reset signal RST transitions from the asserted state to the de-asserted state. The counter 210 is thus out of the reset state. Further, the fourth clock signal CLK4, the first pipeline enable signal PE1, the first division enable signal DE1, and the second output signal OT2 remain de-asserted and the first output signal OT1 remains asserted.

During a time period T3-T4, the third clock signal CLK3 completes multiple clock cycles. Further, the fourth clock signal CLK4, the first pipeline enable signal PE1, the first division enable signal DE1, the reset signal RST, and the second output signal OT2 remain de-asserted and the first output signal OT1 remains asserted.

At time instance T4, the third clock signal CLK3 transitions from the de-asserted state to the asserted state. Further, the fourth clock signal CLK4 transitions from the de-asserted state to the asserted state. Based on the transition of the fourth clock signal CLK4, the first division enable signal DE1 transitions from the de-asserted state to the asserted state, and the counter 210 starts counting the clock pulses of the third clock signal CLK3. Further, the assertion of the first division enable signal DE1 results in the activation of the second comparator 220. The count value CV generated by the counter 210 is compared with the second reference value REF2 to enable the generation of the second output signal OT2. For the sake of ongoing discussion, it is assumed that the second reference value REF2 is five. Thus, the second output signal OT2 transitions from the de-asserted state to the asserted state at the time instance T4. Further, the first pipeline enable signal PE1 and the reset signal RST remain de-asserted and the first output signal OT1 remains asserted at the time instance T4.

During a time period T4-T5, the third clock signal CLK3 completes multiple clock cycles. The fourth clock signal CLK4 transitions from the asserted state to the de-asserted state, and remains in the de-asserted state. In other words, the first clock pulse of the fourth clock signal CLK4 is generated. The first division enable signal DE1 remains asserted. The count value CV thus increases based on the clock pulses of the third clock signal CLK3 but remains less than five during the time period T4-T5. Thus, the second output signal OT2 remains asserted. Further, the first pipeline enable signal PE1 and the reset signal RST remain de-asserted and the first output signal OT1 remains asserted.

At time instance T5, the third clock signal CLK3 transitions from the de-asserted state to the asserted state. Further, the fourth clock signal CLK4 transitions from the de-asserted state to the asserted state. Based on the transition of the fourth clock signal CLK4, the first division enable signal DE1 transitions from the asserted state to the de-asserted state. Thus, the counter 210 is halted. At such a time instance, the count value CV is less than the second reference value REF2. Thus, the second output signal OT2 remains asserted. Further, the first pipeline enable signal PE1 and the reset signal RST remain de-asserted and the first output signal OT1 remains asserted.

During a time period T5-T6, the third clock signal CLK3 completes one clock cycle. The fourth clock signal CLK4 transitions from the asserted state to the de-asserted state, and remains in the de-asserted state. In other words, the second clock pulse of the fourth clock signal CLK4 is generated. Further, the first pipeline enable signal PE1, the first division enable signal DE1, and the reset signal RST remain de-asserted and the first and second output signals OT1 and OT2 remain asserted. The first and second output signals OT1 and OT2 are thus indicative of the presence of the one or more faults in the clocking system 102.

Figure 7A:
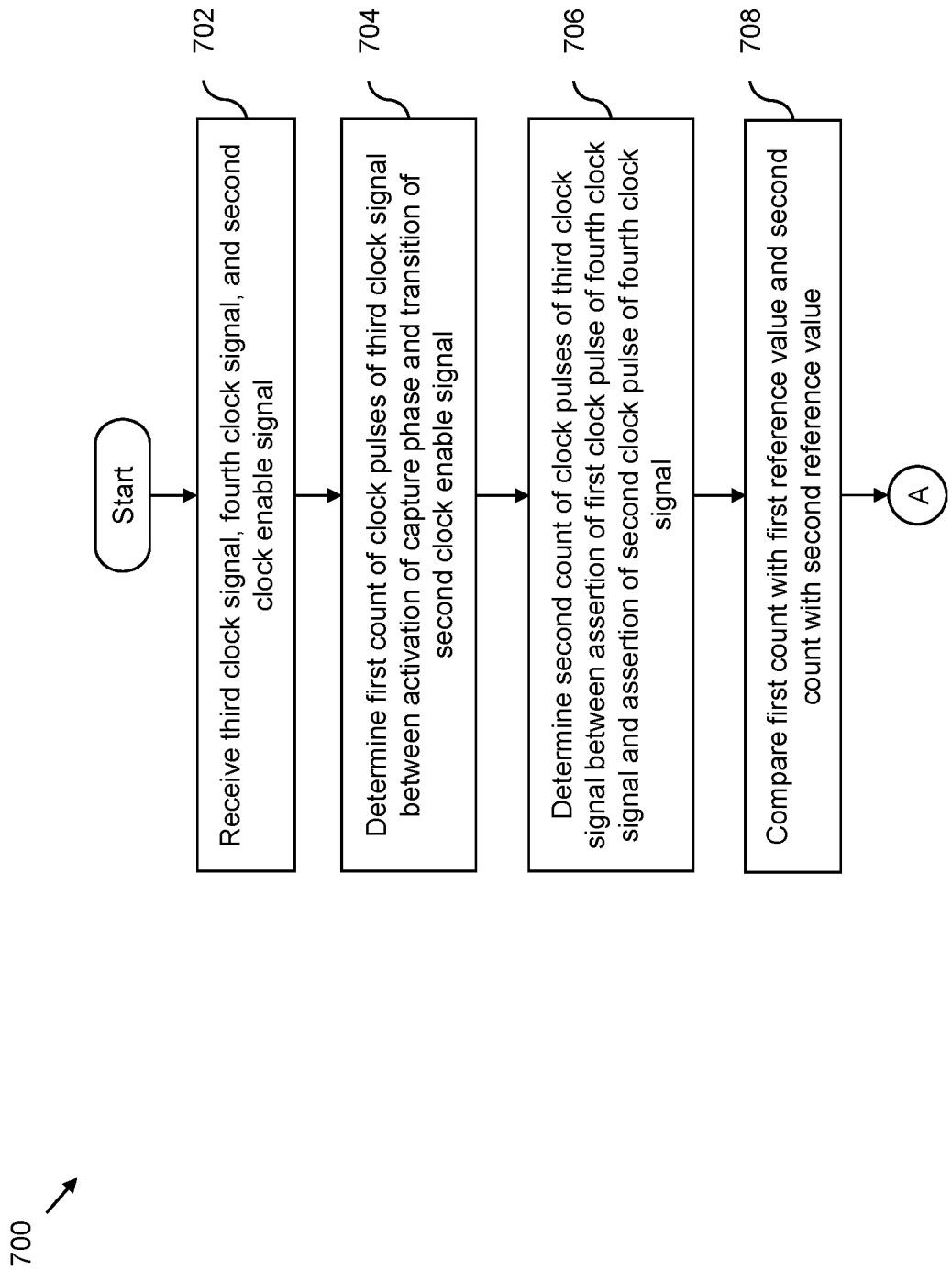
FIGS. 7A and 7B, collectively, represents a flowchart that illustrates a method for testing a clocking system in the IC of FIG. 1 in accordance with an embodiment of the present disclosure.
Figure 7B:
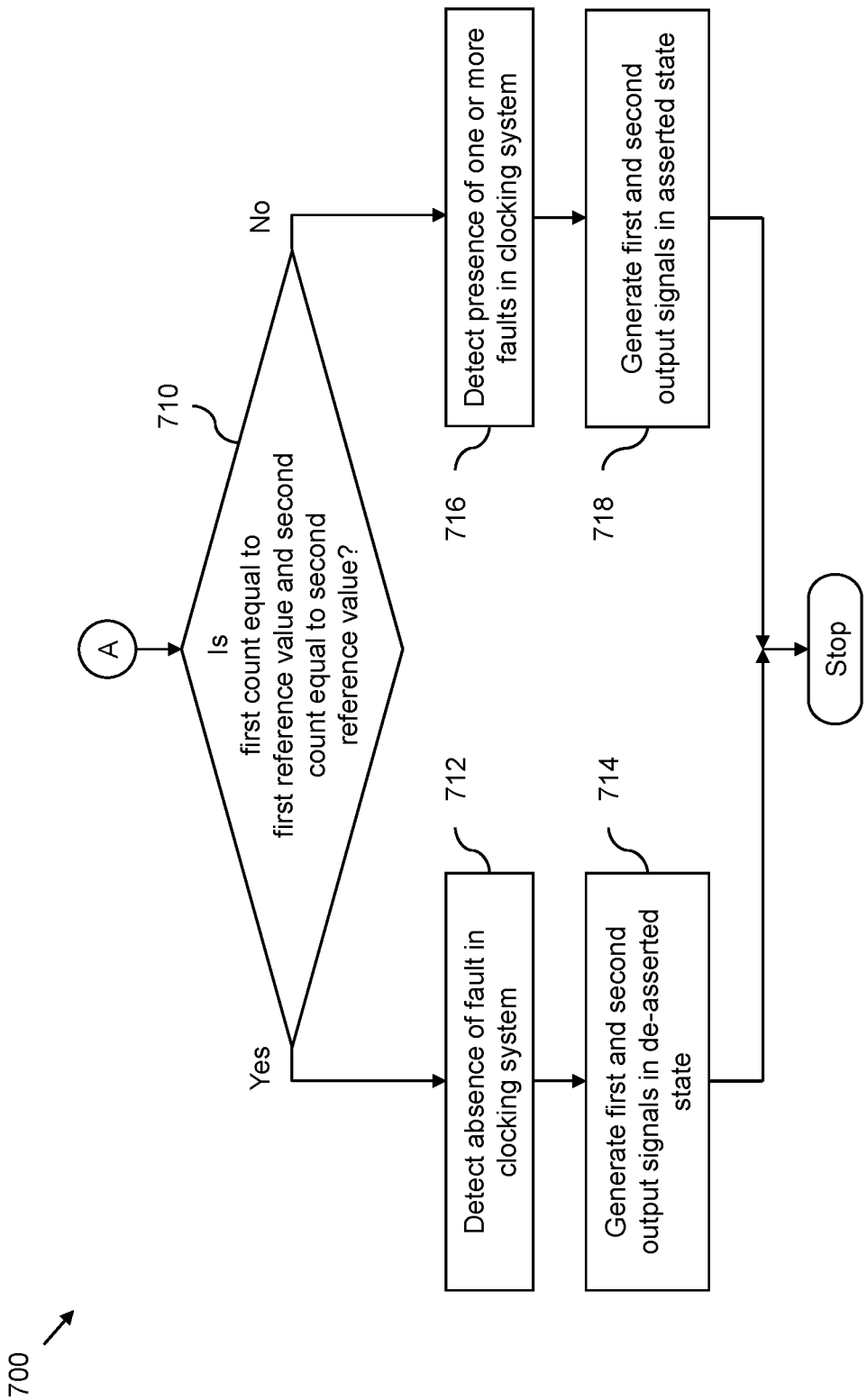

FIGS. 7A and 7B, collectively, represents a flowchart 700 that illustrates a method for testing the clocking system 102 in the IC 100 in accordance with an embodiment of the present disclosure. The method may be implemented by the testing system 104 to detect the one or more faults (e.g., the pipeline fault and the division fault) in the clocking system 102. Referring now to FIG. 7A, at step 702, the testing system 104 may receive the third clock signal CLK3, the fourth clock signal CLK4, and the second clock enable signal CE2 from the clocking system 102.

At step 704, the testing system 104 may determine the first count of clock pulses of the third clock signal CLK3 between the activation of the capture phase and the transition of the second clock enable signal CE2 from the de-asserted state to the asserted state. At step 706, the testing system 104 may determine the second count of clock pulses of the third clock signal CLK3 between the assertion of the first clock pulse of the fourth clock signal CLK4 and the assertion of the second clock pulse of the fourth clock signal CLK4. At step 708, the testing system 104 may compare the first count with the first reference value REF1 and the second count with the second reference value REF2.

Referring now to FIG. 7B, at step 710, the testing system 104 may determine whether the first count is equal to the first reference value REF1 and the second count is equal to the second reference value REF2. If at step 710, the testing system 104 determines that the first count is equal to the first reference value REF1 and the second count is equal to the second reference value REF2, step 712 is performed. At step 712, the testing system 104 may detect the absence of any fault in the clocking system 102. At step 714, the testing system 104 may generate the first output signal OT1 and the second output signal OT2 in the de-asserted state.

If at step 710, the testing system 104 determines that the first count is not equal to the first reference value REF1 and/or the second count is not equal to the second reference value REF2, step 716 is performed. At step 716, the testing system 104 may detect the presence of the one or more faults in the clocking system 102. If the first count does not match the first reference value REF1, the testing system 104 may detect the presence of the pipeline fault in the pipeline circuit 120. Similarly, if the second count does not match the second reference value REF2, the testing system 104 may detect the presence of the division fault in at least one of the enabling circuit 118, the OCC 122, the first logic circuit 124, and the first clock gate 126. For the sake of ongoing discussion, it is assumed that both the first and second counts are not equal to the first and second reference values REF1 and REF2, respectively. At step 718, the testing system 104 may generate the first output signal OT1 and the second output signal OT2 in the asserted state.

The testing system 104 thus enables the testing of the clocking system 102. Typically, during at-speed testing of an IC, a fault in a clocking system of the IC may lead to inaccurate detection of presence or absence of faults in the IC. For example, a faulty clocking system may lead to the IC being deemed faulty even when there are no structural faults in functional components of the IC. In such a scenario, a fault-free IC may be discarded (e.g., may not be employed in the field for its designated application). Similarly, the faulty clocking system may lead to the IC being deemed fault-free even when there are structural faults in the functional components of the IC. In such a scenario, the reliability of the IC significantly degrades. Conventionally, to solve the aforementioned problems, a clocking system is tested for faults based on functional patterns during a functional mode of the IC. The degree of testing provided by the functional patterns is limited. Hence, such a testing of the clocking system is not exhaustive and the reliability of the IC remains degraded.

The testing system 104 enables the testing of the clocking system 102 during the at-speed testing mode. The testing system 104 is implemented in parallel to the clocking system 102, and hence, does not introduce any delay in the functional operations of the clocking system 102 and the scan chain 108. Further, the testing system 104 identifies whether the fault in the clocking system 102 is the pipeline fault (e.g., a fault in the pipeline circuit 120 of the clocking system 102) or the division fault (e.g., a fault in other components, such as the OCC 122, the first clock gate 126, or the like, of the clocking system 102). Thus, a testing technique implemented by the testing system 104 is more exhaustive than conventional testing techniques. As a result, the reliability of the IC 100 is significantly greater than the reliability of ICs where conventional testing techniques are implemented.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The term "assert" is used to mean placing a signal in an active state. For example, for an active-low signal, the signal is at a logic low state when asserted, and for an active-high signal, the signal is at a logic high state when asserted.

The invention claimed is:

1. An integrated circuit (IC), comprising:
   a clocking system configured to generate (i) a first clock signal, (ii) a first clock enable signal that enables division of the first clock signal, and (iii) a second clock signal, wherein the second clock signal is generated based on the first clock signal and the first clock enable signal, wherein during a capture phase of an at-speed testing mode of the IC, the second clock signal is a gated version of the first clock signal and comprises a first clock pulse and a second clock pulse, and wherein the first clock enable signal is de-asserted based on an activation of the capture phase, and during the capture phase, the first clock enable signal transitions to an asserted state based on a pipeline delay associated with the clocking system; and
   a testing system that is coupled to the clocking system, and configured to:
      determine at least one of a group consisting of (i) a first count of clock pulses of the first clock signal between the activation of the capture phase and the transition of the first clock enable signal, and (ii) a second count of clock pulses of the first clock signal between the first clock pulse and the second clock pulse; and
      detect a fault in the clocking system based on at least one of a group consisting of the first count and the second count.

2. The IC of claim 1, wherein the testing system is further configured to compare at least one of a group consisting of (i) the first count with a first reference value and (ii) the second count with a second reference value, and wherein at least one of a group consisting of (i) a mismatch between the first count and the first reference value and (ii) a mismatch between the second count and the second reference value is indicative of a presence of the fault in the clocking system.

3. The IC of claim 1, wherein the testing system comprises a counter that is configured to:
   receive a third clock signal that is generated based on (i) the first clock signal and (ii) at least one of a group consisting of a first pipeline enable signal and a first division enable signal, wherein the first pipeline enable signal is asserted based on the activation of the capture phase, and during the capture phase, the first pipeline enable signal is de-asserted based on the transition of the first clock enable signal, and wherein during the capture phase, the first division enable signal is asserted based on an assertion of the first clock pulse and de-asserted based on an assertion of the second clock pulse; and
   generate a count value based on the third clock signal, wherein when the third clock signal is generated based on the first pipeline enable signal, (i) the third clock signal is same as the first clock signal based on the assertion of the first pipeline enable signal, and the count value is incremented for each clock pulse of the third clock signal, and (ii) the count value when the first pipeline enable signal is de-asserted corresponds to the first count, and wherein when the third clock signal is generated based on the first division enable signal, (i) the third clock signal is same as the first clock signal based on the assertion of the first division enable signal, and the count value is incremented for each clock pulse of the third clock signal, and (ii) the count value when the first division enable signal is de-asserted corresponds to the second count.

4. The IC of claim 3, wherein the testing system further comprises:
   a first flip-flop configured to generate a second pipeline enable signal based on (i) a scan enable signal, (ii) the first pipeline enable signal, and (iii) a fourth clock signal that is generated based on the first clock signal, the first clock enable signal, and the first pipeline enable signal; and
   a first inverter that is coupled to the first flip-flop, and configured to generate the first pipeline enable signal as an inverted version of the second pipeline enable signal, wherein a transition of the scan enable signal from the asserted state to a de-asserted state is indicative of the activation of the capture phase, wherein based on the activation of the capture phase, the second pipeline enable signal is de-asserted and the first pipeline enable signal is asserted, and wherein during the capture phase, based on a transition of the fourth clock signal, the second pipeline enable signal is asserted and the first pipeline enable signal is de-asserted.

5. The IC of claim 4, wherein the testing system further comprises:
   a first logic gate that is coupled to the clocking system, and configured to generate a third pipeline enable signal based on the first clock enable signal and the first pipeline enable signal, wherein the third pipeline enable signal is asserted based on the assertion of the first clock enable signal and the first pipeline enable signal, and the third pipeline enable signal is de-asserted based on the de-assertion of at least one of a group consisting of the first pipeline enable signal and the first clock enable signal; and
   a first clock gate that is coupled to the clocking system, the first logic gate, and the first flip-flop, and configured to generate the fourth clock signal based on the first clock signal and the third pipeline enable signal, and provide the fourth clock signal to the first flip-flop, wherein the fourth clock signal is de-asserted based on the de-assertion of the third pipeline enable signal, and the fourth clock signal is same as the first clock signal based on the assertion of the third pipeline enable signal.

6. The IC of claim 3, wherein the testing system further comprises:
   a second flip-flop configured to generate a second division enable signal based on the first division enable signal and a fifth clock signal, wherein the fifth clock signal is same as the second clock signal during the capture phase; and
   a second inverter that is coupled to the second flip-flop, and configured to generate the first division enable signal as an inverted version of the second division enable signal, wherein based on the activation of the capture phase, the second division enable signal is asserted and the first division enable signal is de-asserted, wherein during the capture phase, (i) the second division enable signal is de-asserted and the first division enable signal is asserted based on the assertion of the first clock pulse, and (ii) the second division enable signal is asserted and the first division enable signal is de-asserted based on the assertion of the second clock pulse, and wherein the first clock pulse and the second clock pulse are sequential.

7. The IC of claim 6, wherein the testing system further comprises a second clock gate that is coupled to the clocking system and the second flip-flop, and configured to generate the fifth clock signal based on the second clock signal and an inverted version of a scan enable signal, and provide the fifth clock signal to the second flip-flop, wherein the fifth clock signal is de-asserted based on an assertion of the scan enable signal, and the fifth clock signal is same as the second clock signal based on a de-assertion of the scan enable signal, and wherein the scan enable signal is de-asserted during the capture phase.

8. The IC of claim 3, wherein the testing system further comprises:
 a first logic circuit configured to generate a counter enable signal based on the first pipeline enable signal and the first division enable signal, wherein during the capture phase, the counter enable signal is asserted based on the assertion of at least one of a group consisting of the first pipeline enable signal and the first division enable signal, and the counter enable signal is de-asserted based on the de-assertion of the first pipeline enable signal and the first division enable signal; and
 a third clock gate that is coupled to the first logic circuit and the counter, and configured to generate the third clock signal based on the first clock signal and the counter enable signal, wherein the third clock signal is de-asserted based on the de-assertion of the counter enable signal, and the third clock signal is same as the first clock signal based on the assertion of the counter enable signal.

9. The IC of claim 3, wherein the testing system further comprises a reset controller that is coupled to the clocking system and the counter, and configured to generate a reset signal and provide the reset signal to the counter to reset the counter, wherein the reset signal is asserted based on the de-assertion of the first pipeline enable signal, and wherein the counter is reset based on the assertion of the reset signal.

10. The IC of claim 9, wherein the reset controller comprises:
 a third flip-flop configured to generate a first control signal based on (i) the first pipeline enable signal and (ii) a sixth clock signal that is generated based on the first clock enable signal and the first clock signal, wherein the first control signal is same as the first pipeline enable signal based on a transition of the sixth clock signal;
 a third inverter that is coupled to the third flip-flop, and configured to generate a second control signal as an inverted version of the first control signal; and
 a fourth flip-flop that is coupled to the clocking system and the third flip-flop, and configured to generate a third control signal based on the first control signal and the first clock signal, wherein the third control signal is same as the first control signal based on a transition of the first clock signal, wherein based on the assertion of the first pipeline enable signal, (i) the first control signal is asserted and the second control signal is de-asserted, and (ii) the reset signal is de-asserted based on the de-assertion of the second control signal, and wherein based on the de-assertion of the first pipeline enable signal, (i) the first control signal is de-asserted and the second control signal is asserted, (ii) the third control signal remains asserted until the transition of the first clock signal, and (iii) the reset signal is asserted based on the assertion of the second control signal and the third control signal.

11. The IC of claim 10, wherein the reset controller further comprises a fourth clock gate that is coupled to the clocking system and the third flip-flop, and configured to generate the sixth clock signal based on the first clock signal and an inverted version of the first clock enable signal, and provide the sixth clock signal to the third flip-flop, wherein the sixth clock signal is the same as the first clock signal based on the de-assertion of the first clock enable signal, and wherein the sixth clock signal is de-asserted based on the assertion of the first clock enable signal.

12. The IC of claim 10, wherein the reset controller further comprises:
 a second logic gate that is coupled to the fourth flip-flop and the third inverter, and configured to generate a fourth control signal based on the second control signal, the third control signal, and an inverted version of the first pipeline enable signal, wherein the fourth control signal is de-asserted based on at least one of (i) the de-assertion of the second control signal, (ii) a de-assertion of the third control signal, and (iii) the assertion of the first pipeline enable signal, and wherein the fourth control signal is asserted based on the assertion of the second control signal, the assertion of the third control signal, and the de-assertion of the first pipeline enable signal; and
 a third logic gate that is coupled to the counter and the second logic gate, and configured to generate the reset signal based on the fourth control signal and a scan enable signal, and provide the reset signal to the counter, wherein during the capture phase, the scan enable signal is de-asserted and the reset signal is same as the fourth control signal.

13. The IC of claim 1, wherein the testing system comprises a first comparator that is configured to compare the first count with a first reference value, detect the fault in the clocking system based on the comparison of the first count with the first reference value, and generate a first output signal indicative of the detected fault, wherein the detected fault corresponds to a pipeline fault associated with the clocking system, and wherein a mismatch between the first count and the first reference value is indicative of a presence of the fault in the clocking system.

14. The IC of claim 13, wherein the testing system further comprises:
 a fifth clock gate that is configured to generate a seventh clock signal based on the first clock signal and a first pipeline enable signal, wherein the first pipeline enable signal is asserted based on the activation of the capture phase, and during the capture phase, the first pipeline enable signal is de-asserted based on the transition of the first clock enable signal, and wherein the seventh clock signal is de-asserted based on the de-assertion of the first pipeline enable signal, and the seventh clock signal is same as the first clock signal based on the assertion of the first pipeline enable signal; and
 a latch that is coupled to the first comparator and the fifth clock gate, and configured to receive the first output signal and the seventh clock signal, and generate a second output signal, wherein the second output signal is same as the first output signal based on an assertion of the seventh clock signal, and wherein the second output signal is a latched version of the first output signal based on the de-assertion of the first pipeline enable signal.

15. The IC of claim 1, wherein the testing system comprises a second comparator that is configured to compare the second count with a second reference value, detect the fault in the clocking system based on the comparison of the second count with the second reference value, and generate a third output signal indicative of the detected fault, wherein the detected fault corresponds to a division fault associated with the first clock pulse and the second clock pulse, and wherein a mismatch between the second count and the second reference value is indicative of a presence of the fault in the clocking system.

16. The IC of claim 1, wherein the clocking system comprises:
   an enabling circuit configured to generate a second clock enable signal based on the first clock signal, wherein the second clock enable signal enables the division of the first clock signal; and
   a pipeline circuit that is coupled to the enabling circuit, and configured to generate the first clock enable signal based on the second clock enable signal, wherein the first clock enable signal is a delayed version of the second clock enable signal, and wherein a delay introduced by the pipeline circuit is indicative of the pipeline delay associated with the clocking system.

17. The IC of claim 16, wherein the clocking system further comprises:
   an on-chip clock controller (OCC) configured to generate a third clock enable signal based on the first clock signal, wherein during the capture phase, the third clock enable signal facilitates the generation of the second clock signal comprising the first clock pulse and the second clock pulse;
   a second logic circuit that is coupled to the pipeline circuit and the OCC, and configured to generate a fourth clock enable signal based on the first clock enable signal, the third clock enable signal, and a scan enable signal, wherein the fourth clock enable signal is asserted based on at least one of a group consisting of (i) an assertion of the scan enable signal and (ii) the assertion of the first clock enable signal and an assertion of the third clock enable signal, and wherein the fourth clock enable signal is de-asserted based on a de-assertion of the scan enable signal and at least one of a group consisting of (i) the de-assertion of the first clock enable signal and (ii) a de-assertion of the third clock enable signal; and
   a sixth clock gate that is coupled to the second logic circuit, and configured to generate the second clock signal based on the first clock signal and the fourth clock enable signal, wherein the second clock signal is de-asserted based on the de-assertion of the fourth clock enable signal, and the second clock signal is same as the first clock signal based on the assertion of the fourth clock enable signal.

18. The IC of claim 16, wherein the clocking system further comprises:
   a first clock generator configured to generate an eighth clock signal associated with a shift phase of the at-speed testing mode;
   a second clock generator configured to generate a ninth clock signal associated with the capture phase; and
   a multiplexer that is coupled to the first clock generator and the second clock generator, and configured to generate the first clock signal based on the eighth clock signal, the ninth clock signal, and a scan enable signal, wherein based on an assertion of the scan enable signal, the first clock signal is same as the eighth clock signal, and based on a de-assertion of the scan enable signal, the first clock signal is same as the ninth clock signal.

19. A method for testing a clocking system in an integrated circuit (IC), the method comprising:
   determining, by a testing system of the IC, at least one of a group consisting of (i) a first count of clock pulses of a first clock signal between an activation of a capture phase of an at-speed testing mode of the IC and a transition of a first clock enable signal, and (ii) a second count of clock pulses of the first clock signal between a first clock pulse of a second clock signal and a second clock pulse of the second clock signal,
      wherein the first clock signal, the first clock enable signal, and the second clock signal are generated by the clocking system,
      wherein the first clock enable signal enables division of the first clock signal,
      wherein the first clock enable signal is de-asserted based on the activation of the capture phase, and during the capture phase, the first clock enable signal transitions to an asserted state based on a pipeline delay associated with the clocking system, and
      wherein the second clock signal is generated based on the first clock signal and the first clock enable signal such that during the capture phase, the second clock signal is a gated version of the first clock signal and comprises the first clock pulse and the second clock pulse; and
   detecting, by the testing system, a fault in the clocking system based on at least one of a group consisting of the first count and the second count.

20. The method of claim 19, further comprising comparing, by the testing system, at least one of a group consisting of (i) the first count with a first reference value and (ii) the second count with a second reference value, wherein at least one of a group consisting of (i) a mismatch between the first count and the first reference value and (ii) a mismatch between the second count and the second reference value is indicative of a presence of the fault in the clocking system.

* * * * *